United States Patent
Bae et al.

(10) Patent No.: US 11,917,885 B2
(45) Date of Patent: Feb. 27, 2024

(54) ELECTRONIC DISPLAY DEVICE INCLUDING QUANTUM DOT FILTER LAYER FOR IMPROVED COLOR PURITY, METHOD FOR MANUFACTURING SAME, AND DISPLAY DEVICE INCLUDING THE SAME

(71) Applicant: SAMSUNG ELECTRONICS CO., LTD., Suwon-si (KR)

(72) Inventors: Min Jong Bae, Yongin-si (KR); Deukseok Chung, Yongin-si (KR); Tae Gon Kim, Hwaseong-si (KR); Shang Hyeun Park, Yongin-si (KR); Shin Ae Jun, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 374 days.

(21) Appl. No.: 17/316,712

(22) Filed: May 10, 2021

(65) Prior Publication Data

US 2021/0351239 A1 Nov. 11, 2021

(30) Foreign Application Priority Data

May 11, 2020 (KR) ........................ 10-2020-0056121

(51) Int. Cl.
*H10K 59/38* (2023.01)
*H10K 50/87* (2023.01)
(Continued)

(52) U.S. Cl.
CPC ........... *H10K 59/38* (2023.02); *H10K 50/856* (2023.02); *H10K 50/858* (2023.02); *H10K 50/87* (2023.02);
(Continued)

(58) Field of Classification Search
CPC .... H10K 50/856; H10K 50/858; H10K 50/87; H10K 59/12; H10K 59/38; H10K 71/00;
(Continued)

(56) References Cited

U.S. PATENT DOCUMENTS 9,331,309 B2 * 5/2016 Kudo .................. H10K 50/856
9,484,504 B2 11/2016 Bibl et al.
(Continued)

FOREIGN PATENT DOCUMENTS

KR 1020120018490 3/2012
KR 1020150096916 8/2015
(Continued)

*Primary Examiner* — Matthew E. Gordon
(74) *Attorney, Agent, or Firm* — CANTOR COLBURN LLP

(57) ABSTRACT

An electronic device includes a first substrate, a plurality of light emitting elements each having a horizontal length and a vertical length which are less than or equal to about 10 micrometers (μm), each of the plurality of light emitting elements being disposed on the first substrate, a quantum dot color filter layer disposed on the plurality of light emitting elements, and a first overcoat layer between a plurality of light emitting elements and the quantum dot color filter layer. The quantum dot color filter layer includes a plurality of quantum dot color filters partitioned by a plurality of first partition walls so as to be overlapped with the plurality of light emitting elements, respectively.

13 Claims, 21 Drawing Sheets

(51) Int. Cl.
*H10K 50/856* (2023.01)
*H10K 50/858* (2023.01)
*H10K 59/12* (2023.01)
*H10K 71/00* (2023.01)
*H10K 102/00* (2023.01)

(52) U.S. Cl.
CPC .............. *H10K 59/12* (2023.02); *H10K 71/00* (2023.02); *H10K 2102/331* (2023.02)

(58) Field of Classification Search
CPC .... H10K 71/40; H10K 71/421; H10K 71/441; H10K 2102/331
See application file for complete search history.

(56) References Cited

U.S. PATENT DOCUMENTS

| | | | | |
|---|---|---|---|---|
| 9,829,710 | B1* | 11/2017 | Newell | H10K 59/1275 |
| 9,971,076 | B2 | 5/2018 | Park et al. | |
| 2013/0015450 | A1* | 1/2013 | Kim | H10K 59/38 |
| | | | | 257/40 |
| 2016/0274406 | A1 | 9/2016 | Kang et al. | |
| 2016/0276418 | A1* | 9/2016 | Xu | H10K 71/00 |
| 2018/0261736 | A1* | 9/2018 | Bonar | H01L 25/167 |
| 2018/0308832 | A1 | 10/2018 | Shin et al. | |
| 2019/0067379 | A1* | 2/2019 | Uchida | H10K 50/81 |
| 2019/0157354 | A1* | 5/2019 | Lee | H01L 33/501 |
| 2020/0279979 | A1 | 9/2020 | Lee et al. | |
| 2021/0057677 | A1* | 2/2021 | Wang | H01L 27/1218 |
| 2021/0151637 | A1* | 5/2021 | Martin | H10K 59/38 |
| 2021/0336171 | A1* | 10/2021 | Peng | H10K 50/865 |
| 2021/0343895 | A1* | 11/2021 | Pan | H01L 33/005 |
| 2022/0085335 | A1* | 3/2022 | Shimatsu | H10K 59/38 |
| 2022/0199695 | A1* | 6/2022 | Takiguchi | G09F 9/30 |
| 2022/0216443 | A1* | 7/2022 | Pschenitzka | H10K 71/00 |

FOREIGN PATENT DOCUMENTS

| | | |
|---|---|---|
| KR | 1020170061765 | 6/2017 |
| KR | 1020180015784 | 2/2018 |
| KR | 101925010 | 12/2018 |
| KR | 1020190038365 | 4/2019 |
| KR | 1020190058130 | 5/2019 |

* cited by examiner

ELECTRONIC DISPLAY DEVICE INCLUDING QUANTUM DOT FILTER LAYER FOR IMPROVED COLOR PURITY, METHOD FOR MANUFACTURING SAME, AND DISPLAY DEVICE INCLUDING THE SAME

This application claims priority to Korean Patent Application No. 10-2020-0056121 filed on May 11, 2020, and all the benefits accruing therefrom under 35 U.S.C. § 119, the content of which in its entirety is herein incorporated by reference.

BACKGROUND

1. Field

Embodiments of an electronic device, a method of manufacturing same, and a display device including the same are disclosed.

2. Description of the Related Art

Currently, a display device such as a liquid crystal display ("LCD"), a plasma display device, an organic light emitting diode ("OLED") display, and the like are commercially available. These may be driven by providing pixels emitting each of red light, green light, blue light and/or white light and individually emitting light, or passing light emitted by a light source through a color filter to express colors corresponding to the pixels.

SUMMARY

In a case of a display device having an individually emitting system, although it tends to have a high color purity enough to provide excellent image quality, but it has a huge process difficulty since each pixel is formed with a member having different materials and characteristics from each other, so that it is difficult to be formed in a large scale.

In a case of aa display device passing light from a light source through a color filter, although it tends to be easily produced in a larger area than the former case, light is absorbed by the color filter, so the energy loss of the emitted light is unavoidable, and it is worried to deteriorate a brightness and a color purity since the final emitted light has a somewhat wide full width at half maximum ("FWHM").

An electronic device capable of displaying a high-resolution image having high light efficiency, color purity, and color reproducibility, a method of manufacturing the same, and a display device including the same are provided.

An electronic device in an embodiment includes a first substrate, a plurality of light emitting elements each having a horizontal length and a vertical length which are less than or equal to about 10 micrometers ($\mu$m), each of the plurality of light emitting elements being disposed on the first substrate, a quantum dot color filter layer disposed on the plurality of light emitting elements, and a first overcoat layer between a plurality of light emitting elements and the quantum dot color filter layer. The quantum dot color filter layer includes a plurality of quantum dot color filters partitioned by a plurality of first partition walls so as to be overlapped with the plurality of light emitting elements, respectively.

In an embodiment, the plurality of quantum dot color filters may include a first quantum dot color filter including quantum dots which convert third light into first light, and a second quantum dot color filter including quantum dots which convert third light into second light.

In an embodiment, the quantum dot color filter layer may further include a transmission layer that does not include the quantum dot color filter.

In an embodiment, the electronic device may further include a light guide layer between the plurality of light emitting elements and the first overcoat layer, and the light guide layer may include a plurality of second partition walls overlapped with the plurality of first partition walls.

In an embodiment, a space partitioned by the plurality of second partition walls in the light guide layer may be defined as an empty space or may be filled with a gas, an organic material, an inorganic material, or an auxiliary color filter.

In an embodiment, the electronic device may further include a thin film encapsulation layer between the quantum dot color filter layer and the first overcoat layer, or between the first overcoat layer and the light guide layer.

In an embodiment, the thin film encapsulation layer may have a thickness of about 50 nanometers (nm) to about 1000 nm.

In an embodiment, a surface of the thin film encapsulation layer facing the quantum dot color filter layer may have a concavo-convex structure.

In an embodiment, the thin film encapsulation layer may include a metal oxide, a metal nitride, a metal oxynitride, or a combination thereof.

In an embodiment, the electronic device may further include a heat dissipation layer or a Bragg reflector between the thin film encapsulation layer and the quantum dot color filter layer, and/or between the thin film encapsulation layer and the plurality of light emitting elements.

In an embodiment, each of the plurality of light emitting elements may include a first conductivity-type semiconductor layer on a first substrate, a second conductivity-type semiconductor layer overlapped with the first conductivity-type semiconductor layer, and an active layer between the first conductivity-type semiconductor layer and the second conductivity-type semiconductor layer.

In an embodiment, the light guide layers is provided in plural such that two or more light guide layers may be stacked apart from each other at a predetermined distance.

In an embodiment, the quantum dot color filter layer is provided in plural such that two or more quantum dot color filter layers may be stacked apart from each other at a predetermined distance.

A method of manufacturing an electronic device in another embodiment includes disposing a plurality of light emitting elements having a width and a length which are less than or equal to about 10 $\mu$m, on a first substrate, forming a plurality of first partition walls on a second substrate to define a region overlapping each of the plurality of light emitting elements, forming a quantum dot color filter layer by injecting a quantum dot color filter composition into regions partitioned by the plurality of first partition walls, forming a first overcoat layer on the quantum dot color filter layer, bonding the first overcoat layer of the second substrate over the light emitting elements of the first substrate.

In an embodiment, the manufacturing method may further include forming a light guide layer on the plurality of light emitting elements, and the light guide layer may include a plurality of second partition walls overlapped with the plurality of first partition walls disposed on the second substrate.

In an embodiment, the manufacturing method may further include forming a thin film encapsulation layer before the forming the first overcoat layer or after the forming the first overcoat layer.

In an embodiment, the light guide layer is provided in plural such that two or more light guide layers may be stacked apart from each other by a predetermined distance.

In an embodiment, the quantum dot color filter is provided in plural such that two or more quantum dot color filter layers may be stacked apart from each other at a predetermined distance.

A display device in another embodiment includes an electronic device.

An electronic device capable of displaying a high-resolution image with high light efficiency, color purity, and color reproducibility, a method for manufacturing the same, and a display device including the same are provided.

BRIEF DESCRIPTION OF THE DRAWINGS

The above and other embodiments, advantages and features of this disclosure will become more apparent by describing in further detail embodiments thereof with reference to the accompanying drawings, in which.

DETAILED DESCRIPTION

Figure 1:
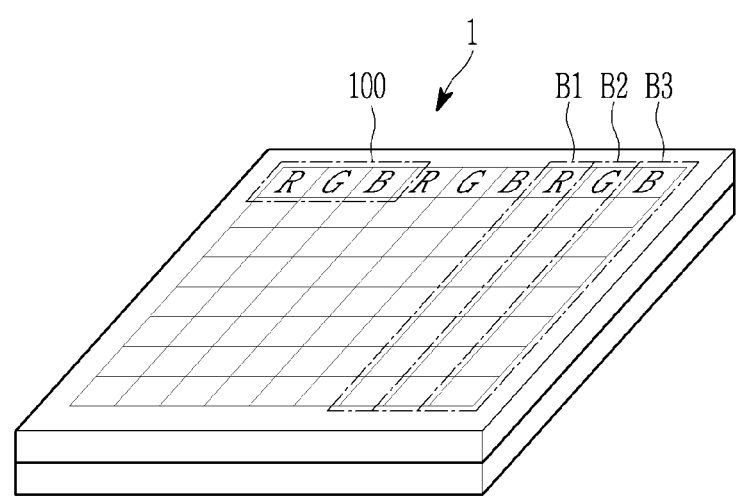
FIG. 1 is a schematic perspective view of an embodiment of a display device in an embodiment.
Figure 1:
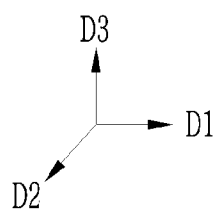

Hereinafter, referring to the drawings, embodiments are described in detail. In the following description of the disclosure, the well-known functions or constructions will not be described in order to clarify the disclosure.

In order to clearly illustrate the disclosure, the description and relationships are omitted, and throughout the disclosure, the same or similar configuration elements are designated by the same reference numerals. Also, since the size and thickness of each configuration shown in the drawing are arbitrarily shown for better understanding and ease of description, the disclosure is not necessarily limited thereto.

In the drawings, the thickness of layers, films, panels, regions, etc., are exaggerated for clarity. The thickness of some layers and regions is exaggerated for better understanding and ease of description in the drawings. It will be understood that when an element such as a layer, film, region, or substrate is referred to as being "on" another element, it can be directly on the other element or intervening elements may also be present.

It will be understood that, although the terms "first," "second," "third" etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Hereinafter, an electronic device 100 in an embodiment and a display device 1 including the same are described with reference to FIGS. 1 to 2.

Figure 2:
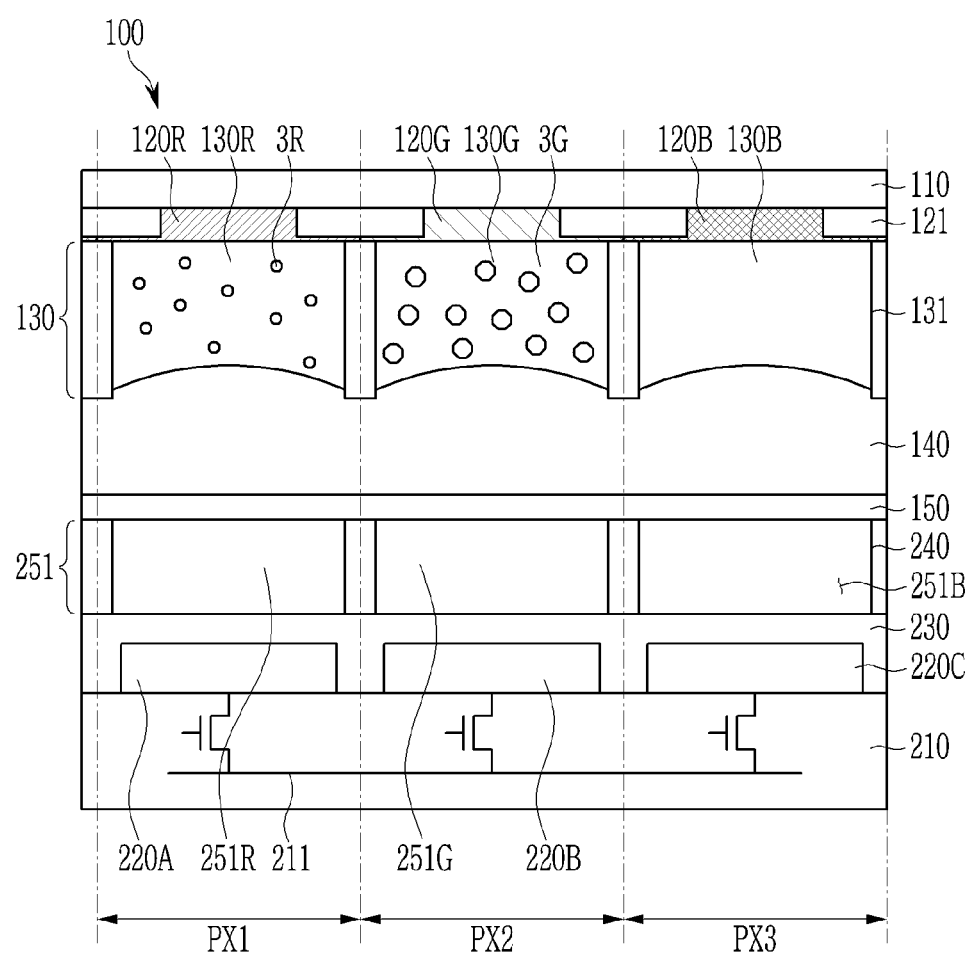
FIG. 2 is a schematic cross-sectional view of an embodiment of an electronic device in an embodiment.

FIG. 1 is a schematic perspective view of an embodiment of a display device 1 and FIG. 2 is a schematic cross-sectional view of an embodiment of an electronic device.

Referring to FIG. 1, a display device 1 in an embodiment includes a plurality of electronic devices 100, and each electronic device 100 may selectively emit red R, green G, or blue B light In an embodiment, the electronic device 100 may include three pixel areas, e.g., a red pixel area R, green pixel area G, and blue pixel area B.

In an embodiment, a plurality of pixel areas R arranged along the direction D2 may emit the same color, for example. In an embodiment, a plurality of pixel areas R along a first column (or row) B1 may emit red light, a plurality of pixel areas G along a second column (or row) B2 may emit green light, and a plurality of pixel areas B along a third column (or row) B3 may emit blue light, for example. In an embodiment, a plurality of pixel areas R included in the first column (or row) B1 may be electrically connected to each other, a plurality of pixel areas G included in the second column (or row) B2 may be electrically connected to each other, and a plurality of pixel areas B included in the third column (or row) B3 may also be electrically connected to each other, for example.

Hereinafter, the electronic device 100 is described with reference to FIG. 2, which is a cross-sectional view taken along directions D1 and D3 (D1×D3) in FIG. 1.

First, referring to FIG. 2, the electronic device 100 in an embodiment includes a first substrate 210, a plurality of light emitting elements 220A, 220B, and 220C on the first substrate 210, and a quantum dot color filter layer 130 on the plurality of light emitting elements 220A, 220B, and 220C, and a first overcoat layer 140 between the plurality of light emitting elements 220A, 220B, and 220C and the quantum dot color filter layer 130.

The first substrate 210 may be a transparent substrate. In an embodiment, the first substrate 210 may include sapphire ($Al_2O_3$), gallium nitride (GaN), silicon carbide (SiC), gallium oxide ($Ga_2O_3$), lithium gallium oxide ($LiGaO_2$), lithium aluminum oxide ($LiAlO_2$), or magnesium aluminum oxide ($MgAl_2O_4$), for example.

An integrated circuit ("IC") unit 211 including a driver which supplies power to each of the light emitting elements 220A, 220B, and 220C and a controller which controls each of the light emitting elements 220A, 220B, and 220C may be included on the top of the first substrate 210 and/or inside the first substrate 210. FIG. 2 is a cross-sectional view of the electronic device 100, but for effective understanding, the IC unit 211 is illustrated using a transistor circuit.

A plurality of light emitting elements 220A, 220B, and 220C which emit blue light may be disposed on the first substrate 210. The plurality of light emitting elements 220A, 220B, and 220C may emit light by an applied power source or a driving signal.

The plurality of light emitting elements 220A, 220B, and 220C may include a semiconductor light emitting chip such as a light emitting diode ("LED"). The plurality of light emitting elements 220A, 220B, and 220C may include a first light emitting element 220A in the first pixel area PX1 of the electronic device 100, and a second light emitting element 220B in the second pixel area PX2, and a third light emitting element 220C in the third pixel area PX3.

Figure 8:
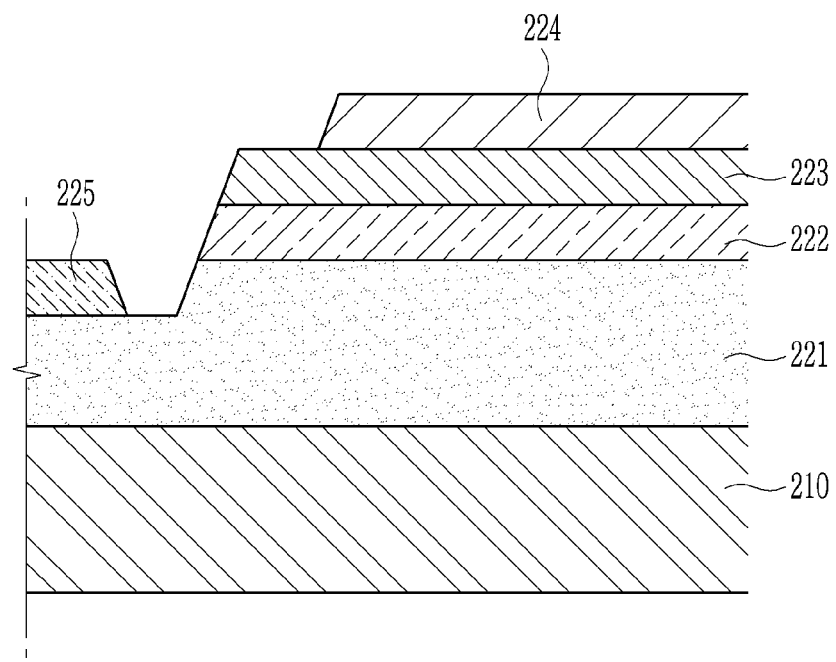
FIG. 8 is a schematic cross-sectional view of an embodiment of a light emitting element.

A stacked structure of the individual light emitting elements 220A, 220B and 220C is described with reference to FIG. 8.

In an embodiment, the central wavelength of light emitted from the plurality of light emitting elements 220A, 220B, and 220C may be about 430 nanometers (nm) to about 470 nm, and for example, may be about 440 nm to about 460 nm. A display device 1 in an embodiment may have, for example, a pixel density of greater than or equal to about 2000 pixels per inch (ppi), greater than or equal to about 2500 ppi, greater than or equal to about 3000 ppi, greater than or equal to about 4000 ppi, greater than or equal to about 4500 ppi, or greater than or equal to about 5000 ppi.

Accordingly, the horizontal length and the vertical length of each of the light emitting elements 220A, 220B, and 220C, and a pitch between adjacent light emitting elements 220A, 220B, and 220C may be very small compared with the horizontal length of the pixels and the pitch between the pixels of common display devices, for example, an organic LED ("OLED") display, and/or other display devices. In an embodiment, each of the light emitting elements 220A, 220B, and 220C may be a micro LED, for example. In the specification of the invention, the horizontal length means the length in the D1 direction in FIG. 1, and the vertical length means the length in the D2 direction.

In an embodiment, the horizontal length and the vertical length of each of the plurality of light emitting elements 220A, 220B, and 220C may be adjusted to fall within a range, for example, less than or equal to about 10 micrometers (μm), less than or equal to about 9 μm, less than or equal to about 8 μm, less than or equal to about 7 μm, or less than or equal to about 6 μm, for example, about 0.5 μm to about 10 μM, about 0.5 μm to about 9 μm, about 0.5 μm to about 8 μm, about 0.5 μm to about 7 μm, or about 0.5 μm to about 6 μm so that the display device 1 may display an ultra-high resolution image having the aforementioned pixel density.

In an embodiment, the pitch between the adjacent light emitting elements 220A, 220B, and 220C may be for example, less than or equal to about 10 μm, less than or equal to about 9 μm, less than or equal to about 8 μm, less than or equal to about 7 μm, or less than or equal to about 6 μm, for example, about 0.5 μm to about 10 μm, about 0.5 μm to about 9 μm, about 0.5 μm to about 8 μm, about 0.5 μm to about 7 μm, or about 0.5 μm to about 6 μm so that the display device 1 may display an ultra-high resolution image having the aforementioned pixel density.

When the horizontal length and the vertical length of each of the plurality of plurality of light emitting elements 220A, 220B, and 220C and/or the pitch between the light emitting elements 220A, 220B, and 220C satisfy the above ranges, the display device 1 including the same may display an image with ultra-high resolution and ultra-high brightness compared with conventional display devices.

As an example, a plurality of light emitting elements 220A, 220B, and 220C may be electrically connected to each other. In an embodiment, the first light emitting elements 220A disposed in the first pixel area PX1 may be electrically connected to each other, for example. The second light emitting elements 220B disposed in the second pixel area PX2 may be electrically connected to each other. The third light emitting elements 220C disposed in the third pixel area PX3 may be electrically connected to each other. In an embodiment, the first light emitting elements 220A may be electrically connected through a drain electrode, for example. This is also the same for the second light emitting elements 220B and the third light emitting elements 220C.

Due to this connection, the light emitting elements 220A, 220B, and 220C in a region emitting light of the same color may be simultaneously driven. In an embodiment, a configuration in which the drain electrodes are connected to each other has been described, but it is not limited thereto, and any wiring connection through which a plurality of light emitting elements 220A, 220B, and 220C may be simultaneously driven may be enabled.

A protective layer 230 may be disposed on the plurality of light emitting elements 220A, 220B, and 220C. The protective layer 230 may be an inorganic material or an organic material. When the protective layer 230 includes an inorganic material, the inorganic material may include silicon oxide or silicon nitride. The protective layer 230 may planarize the upper surface while covering the plurality of light emitting elements 230.

A quantum dot color filter layer 130 may be disposed on the plurality of light emitting elements 220A, 220B, and 220C.

The quantum dot color filter layer 130 may include a plurality of quantum dot color filters 130R and 130G partitioned by a plurality of first partition walls 131 so as to be overlapped with the plurality of light emitting elements 220A, 220B, and 220C, respectively.

In an embodiment, the quantum dot color filter layer 130 may include a first quantum dot color filter 130R including quantum dots 3R that converts third light into a first light, and a second quantum dot color filter 130G including quantum dots 3G that converts third light into a second light, and a transmission layer 130B not including the quantum dot color filter, for example.

In an embodiment, the first quantum dot color filter 130R may include red quantum dots 3R, for example. Accordingly, the incident blue light may be converted into red light and then emitted.

In an embodiment, the second quantum dot color filter 130G may include green quantum dots 3G, for example. Accordingly, the incident blue light may be converted into green light and then emitted.

The transmission layer 130B emits incident light as it is without converting the incident light. Blue light may be incident on the transmission layer 130B and blue light may be emitted as it is.

Each of the first quantum dot color filter 130R, the second quantum dot color filter 130G, and the transmission layer 130B may be spaced apart by the aforementioned plurality of first partition walls 131.

Each of the first quantum dot color filter 130R, the second quantum dot color filter 130G, and the transmission layer 130B may be disposed to be overlapped with each of the first to third light emitting elements 220A, 220B, and 220C.

The first overcoat layer 140 may cover and planarize the surfaces of the first quantum dot color filter 130R and the second quantum dot color filter 130G, and may fill an empty space of the transmission layer 130B.

The first overcoat layer 140 may be an inorganic material or an organic material. When the first overcoat layer 140 includes an inorganic material, the inorganic material may include silicon oxide or silicon nitride.

A thickness of the first overcoat layer 140 varies depending on the thickness of the quantum dot color filter layer 130, the target thickness of the electronic device 100, and the brightness and/or heat generation of each of the light emitting elements 220A, 220B, and 220C. In an embodiment, the thickness of the first overcoat layer 140 may be, for example, greater than or equal to about 1 μm, greater than or equal to about 2 μm, greater than or equal to about 3 μm, greater than or equal to about 4 μm, or greater than or equal to about 5 μm, and, for example, less than or equal to about 10 μm, less than or equal to about 9 μm, or less than or equal to about 8 μm, for example, about 1 μm to about 10 μm, about 1 μm to about 9 μm, about 1 μm to about 8 μm, about 2 μm to about 8 μm, about 3 μm to about 8 μm, about 4 μm to about 8 μm, or about 5 μm to about 8 μm.

When the thickness of the first overcoat layer 140 satisfies the above-described range, the quantum dot color filter layer 130 may be easily planarized and heat transferred from the plurality of light emitting elements 220A, 220B, and 220C may be absorbed and/or blocked, and thus degradation of the quantum dot color filter layer 130 may be prevented.

A light guide layer 251 may be disposed between the plurality of light emitting elements 220A, 220B, and 220C and the first overcoat layer 140.

The light guide layer 251 includes a plurality of second partition walls 240 overlapped with the plurality of first partition walls 131.

The second partition walls 240 may be arranged in a lattice shape along the D1 direction and D2 direction of FIG. 1. The spaces 251R, 251G, and 251B partitioned by the plurality of second partition walls 240 in the light guide layer 251 may guide the blue light emitted from the plurality of light emitting elements 220A, 220B, and 220C so that it may be supplied to the quantum dot color filter layer 130. The spaces 251R, 251G, and 251B partitioned by the second partition walls 240 may be defined as empty spaces. In an alternative embodiment, the spaces 251R, 251G, and 251B partitioned by the second partition walls 240 may be filled with a predetermined gas, or may be filled with an organic material, an inorganic material, or an auxiliary color filter. Exemplary variations hereof are described in detail with reference to FIGS. 9 and 11.

The thin film encapsulation layer 150 may be disposed between the quantum dot color filter layer 130 and the first overcoat layer 140, or between the first overcoat layer 140 and the light guide layer 251. The thin film encapsulation layer 150 may serve to seal the quantum dot color filter layer 130 so that the quantum dot color filter layer 130 may not be exposed to external air or foreign substances.

In an embodiment, the thin film encapsulation layer 150 may include an inorganic material, for example. The inorganic material may include a metal oxide, a metal nitride, a metal oxynitride, or a combination thereof. Examples of materials applicable to the thin film encapsulation layer 150 may include SiON, $Al_2O_3$, $SiO_2$, or a combination thereof. However, the invention is not limited thereto, and the thin film encapsulation layer 150 may further include an organic material to improve sealing properties in addition to the aforementioned inorganic material. Examples of the organic material include epoxy-based resins, polyimide-based resins, and the like, and may be materials capable of being inkjet-printed.

In an embodiment, the thin film encapsulation layer 150 may include an inorganic layer including the aforementioned inorganic material, for example. In an embodiment, the thin film encapsulation layer 150 may include a layer in which the aforementioned inorganic material and organic material are mixed, for example In an embodiment, the thin film encapsulation layer 150 may include both an inorganic layer and an organic layer, for example.

The thin film encapsulation layer 150 may have a single layer or a multilayer structure of two or more layers. In an embodiment, the thin film encapsulation layer 150 may have a structure in which an inorganic layer and an organic layer are alternately stacked one or more times, for example.

The thin film encapsulation layer 150 may be adjusted to have a predetermined thickness for miniaturization of the electronic device 100 while maintaining excellent sealing characteristics of the quantum dot color filter layer 130. In an embodiment, thin film encapsulation layer 150 may have a thickness of greater than or equal to about 50 nm, for example, greater than or equal to about 100 nm, greater than or equal to about 150 nm, greater than or equal to about 200 nm, greater than or equal to about 250 nm, or greater than or equal to about 300 nm, and, for example, less than or equal to about 1000 nm, less than or equal to about 950 nm, less than or equal to about 900 nm, less than or equal to about 850 nm, less than or equal to about 800 nm, less than or equal to about 750 nm, less than or equal to about 700 nm, less than or equal to about 650 nm, or less than or equal to about 600 nm, or for example, about 50 nm to about 1000 nm, about 100 nm to about 1000 nm, about 100 nm to about 800 nm, about 100 nm to about 700 nm, or about 200 nm to about 600 nm.

Figure 3:
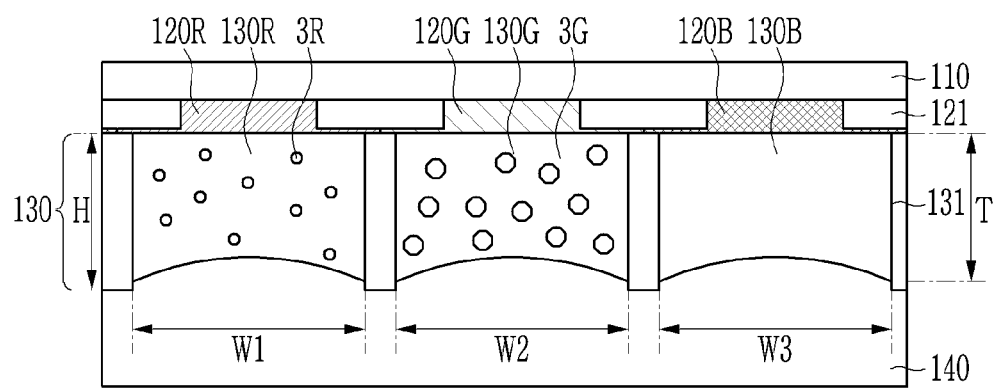
FIG. 3 is a view separate showing a quantum dot color filter layer and a first overcoat layer disposed thereunder in the electronic device of FIG. 2.

FIG. 3 is a view separate showing a quantum dot color filter layer 130 and a first overcoat layer 140 disposed thereunder in the electronic device of FIG. 2.

As shown in FIG. 3, the horizontal length W1 of the first quantum dot color filter 130R, the horizontal length W2 of the second quantum dot color filter 130G, and the horizontal length W3 of the transmission layer 130B may be respectively less than or equal to about 10 μm, less than or equal to about 9 μm, less than or equal to about 8 μm, less than or equal to about 7 μm, or less than or equal to about 6 μm, and for example, greater than or equal to about 0.5 μm, greater than or equal to about 1 μm, greater than or equal to about 1.5 μm, or greater than or equal to about 2 μm, for example, about 0.5 μm to about 10 μm, about 0.5 μm to about 9 μm, about 0.5 μm to about 8 μm, about 0.5 μm to about 7 μm, or about 1 μm to about 10 μm.

In an embodiment, the pitch of the adjacent first quantum dot color filter 130R, the second quantum dot color filter 130G, and the transmission layer 130B may satisfy a range less than or equal to about 10 μm, less than or equal to about 9 μm, less than or equal to about 8 μm, less than or equal to about 7 μm, or less than or equal to about 6 μm, and for example, greater than or equal to about 0.5 μm, greater than or equal to about 1 μm, greater than or equal to about 1.5 μm, or greater than or equal to about 2 μm, for example, about 0.5 μm to about 10 μm, about 0.5 μm to about 9 μm, about 0.5 μm to about 8 μm, about 0.5 μm to about 7 μm, or about 1 μm to about 10 μm.

In this way, by adjusting the horizontal length of each of the first quantum dot color filter 130R, the second quantum dot color filter 130G, and the transmission layer 130B, and/or the pitch of the adjacent first quantum dot color filter 130R, the second quantum dot color filter 130G, and the transmission layer 130B, the blue light supplied from the plurality of light emitting elements 220A, 220B, and 220C in respective pixel area PX1, PX2, and PX3 may be well incident on the first quantum dot color filter 130R, the second quantum dot color filter 130G, and the transmission layer 130B.

In an embodiment, the height T of the plurality of quantum dot color filters 130R and 130G and the transmission layer 130B may be equal to the height (H) of the first partition walls 131 or may be lower than the height H of the first partition walls 131. That is, each height T of the first quantum dot color filter 130R, the second quantum dot color filter 130G, and the transmission layer 130B may be less than or equal to the height H of the first partition walls 131.

The quantum dots 3R and 3G included in the first quantum dot color filter 130R and the second quantum dot color filter 130G may be independently include one of a Group II-VI compound, a Group III-V compound, a Group IV-VI compound, a Group IV element, a Group IV compound, and a combination thereof.

In an embodiment, the Group II-VI compound may include a binary element compound including one of CdSe, CdTe, ZnS, ZnSe, ZnTe, ZnO, HgS, HgSe, HgTe, MgSe, MgS, and a combination thereof, a ternary element compound including one of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof, and a quaternary element compound including one of HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof, for example.

In an embodiment, the Group III-V compound may include a binary element compound including one of GaN, GaP, GaAs, GaSb, AlN, AlP, AJAs, AlSb, InN, InP, InAs, InSb, and a combination thereof, a ternary element compound including one of GaNP, GaNAs, GaNSb, GaPAs, GaPSb, AlNP, AlNAs, AlNSb, AlPAs, AlPSb, InNP, InNAs, InNSb, InPAs, InPSb, and a combination thereof, and a quaternary element compound including one of GaAlNAs, GaAlNSb, GaAlPAs, GaAlPSb, GaInNP, GaInNAs, GaInNSb, GaInPAs, GaInPSb, GaAlNP, InAlNP, InAlNAs, InAlNSb, InAlPAs, InAlPSb, and a combination thereof, for example.

In an embodiment, the Group IV-VI compound may include a binary element compound including one of SnS, SnSe, SnTe, PbS, PbSe, PbTe, and a combination thereof, a ternary element compound including one of SnSeS, SnSeTe, SnSTe, PbSeS, PbSeTe, PbSTe, SnPbS, SnPbSe, SnPbTe, and a combination thereof, and a quaternary element compound including one of SnPbSSe, SnPbSeTe, SnPbSTe, and a combination thereof. The Group IV element may include one of Si, Ge, and a combination thereof. The Group IV compound may include a binary element compound including one of SiC, SiGe, and a combination thereof, for example.

The binary element compound, the ternary element compound, or the quaternary element compound respectively exists in a uniform concentration in the particle or in partially different concentrations in the same particle.

One quantum dot may surround other quantum dot to provide a core/shell structure. The core and the shell may have a concentration gradient wherein the concentration of the element(s) of the shell decreases toward the core.

In an embodiment, the quantum dots 3R and 3G may have a full width of half maximum ("FWHM") of a photoluminescence wavelength of less than or equal to about 45 nm, for example, less than or equal to about 40 nm, or less than or equal to about 30 nm. Color purity and color reproducibility thereof may be improved within the ranges. Also, the light emitted through these quantum dots 3R and 3G is emitted in all directions, and the viewing angle may be improved.

The quantum dots 3R and 3G may be commercially available or may be synthesized in any method. In an embodiment, quantum dots may be a colloidal particle synthesized according to a wet chemical process, for example. In the wet chemical process, precursors react in an organic solvent to grow crystal particles, and the organic solvent or a ligand compound may coordinate the surface of the quantum dots, controlling the growth of the crystal. Examples of the organic solvent and the ligand compound are known. In the chemical wet process, the synthesized colloidal quantum dot may be collected by adding a non-solvent to a reaction solution and centrifuging a final combination. Such a collecting process may cause removal of at least one part of the organic materials coordinated on the surface of the quantum dots. Examples of the non-solvent may be acetone, ethanol, methanol, and the like, but are not limited thereto.

The quantum dots 3R and 3G may have an organic ligand bound to their surface. In an embodiment, the organic ligand may have a hydrophobic moiety. In an embodiment, the organic ligand may include one of RCOOH, $RNH_2$, $R_2NH$, $R_3N$, RSH, $R_3PO$, $R_3P$, ROH, RCOOR', $RPO(OH)_2$, $R_2POOH$ (wherein, R and R' are independently hydrogen, a C5 to C24 substituted or unsubstituted aliphatic hydrocarbon group, for example, a C5 to C24 alkyl group, a C5 to C24 alkenyl group, or a C5 to C20 aromatic hydrocarbon group, for example, a C6 to C20 aryl group, provided that at least one thereof is not hydrogen), or a combination thereof.

Examples of the organic ligand may include thiol compounds such as methane thiol, ethane thiol, propane thiol, butane thiol, pentane thiol, hexane thiol, octane thiol, dodecane thiol, hexadecane thiol, octadecane thiol, or benzyl thiol, amines such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, or trioctylamine, carboxylic acid compounds such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid, phosphine compounds such as methyl phosphine, ethyl phosphine, propyl phosphine, butyl phosphine, pentyl phosphine, octylphosphine, dioctyl phosphine, tributylphosphine, or trioctylphosphine, phosphine compounds or oxide compounds thereof such as methyl phosphine oxide, ethyl phosphine oxide, propyl phosphine oxide, butyl phosphine oxide, pentyl phosphine oxide, tributyl phosphine oxide, octylphosphine oxide, dioctyl phosphine oxide, or trioctyl phosphine oxide, diphenyl phosphine, triphenyl phosphine, or oxide compounds thereof, C5 to C20 (mono- or di) alkylphosphinic acid such as (mono- or di) hexylphosphinic acid, (mono- or di) octylphosphinic acid, (mono- or di) dodecanephosphinic acid, (mono- or di) tetradecanephosphinic acid, (mono- or di) hexadecanephosphinic acid, or (mono- or di) octadecanephosphinic acid, C5 to C20 alkyl phosphonic acid such as hexylphosphonic acid, octylphosphonic acid, dodecanephosphonic acid, tetradecanephosphonic acid, hexadecanephosphonic acid, octadecanephosphonic acid, and the like, but are not limited thereto. The quantum dots 3R and 3G may include the organic ligand alone or as a combination of two or more.

In an embodiment, when the quantum dots 3R and 3G include red quantum dots 3R, the red quantum dots 3R may include at least one of (Ca, Sr, Ba)S, $(Ca, Sr, Ba)_2Si_5N_8$, $CaAlSiN_3$, $CaMoO_4$, and $Eu_2Si_5N_8$, but is not limited thereto.

In an embodiment, when the quantum dots 3R and 3G include green quantum dots 3G, the green quantum dots 3G may include at least one of yttrium aluminum garnet ("YAG"), $(Ca, Sr, Ba)_2SiO_4$, $SrGa_2S_4$, barium magnesium aluminate ("BAM"), alpha SiAlON (α-SiAlON), beta SiAlON (β-SiAlON), $Ca_3Sc_2Si_3O_{12}$, $Tb_3Al_5O_{12}$, $BaSiO_4$, CaAlSiON, and $(Sr_{1-x}Ba_x)Si_2O_2N_2$, but is not limited thereto. The x may be any number between 0 to 1.

The transmission layer 130B may transmit an incident light as it is. The transmission layer 130B may include a transparent resin transmitting blue light. The transmission layer 130B disposed in a region where the blue light emits includes separate quantum dots and transmits the incident blue light as it is.

Although not shown in the drawings, the transmission layer 130B may further include at least either of a dye and a pigment. The transmission layer 130B including the dye or the pigment may reduce reflection of an external light and provide blue light having improved color purity.

In another embodiment, the transmission layer 130B may be omitted, and in this case, the first overcoat layer 140 may fill an empty space instead.

At least one of the first quantum dot color filter 130R and the second quantum dot color filter 130G may further include a scattering body (not shown). Amounts of each scattering body included in the first quantum dot color filter 130R or the second quantum dot color filter 130G may be different. The scattering body may increase an amount of light that is converted or passed through the first and second quantum dot color filters 130R and 130G to be emitted, and uniformly provides front and side brightnesses.

The scattering body may include any material for uniformly scattering incident light. In an embodiment, the scattering body may include at least one of $TiO_2$, $ZrO_2$, $Al_2O_3$, $In_2O_3$, ZnO, $SnO_2$, $Sb_2O_3$, and indium tin oxide ("ITO"), for example.

The first quantum dot color filter 130R, the second quantum dot color filter 130G, and the transmission layer 130B may include, for example, a photosensitive resin and may be provided through a photolithography process.

A planar area of each of the first quantum dot color filter 130R, the second quantum dot color filter 130G, and the transmission layer 130B may be larger than a planar area of each of the light emitting elements 220A, 220B, and 220C. Light emitted from each of the light emitting elements 220A, 220B, and 220C may have a Lambertian distribution. Blue light having a Lambertian distribution may be incident on an area larger than an emission area.

In an embodiment, the first quantum dot color filter 130R, the second quantum dot color filter 130G, and the transmission layer 130B may have a horizontal or vertical length-to-height ratio of about 4:1 to about 1:1, for example. When the horizontal or vertical length-to-height ratio of each of the first quantum dot color filter 130R, the second quantum dot color filter 130G, and the transmission layer 130B increases to about 1:1, the first quantum dot color filter 130R, the second quantum dot color filter 130G, and the transmission layer 130B may have a considerably narrow horizontal or vertical length, that is, a high horizontal or vertical length-to-height ratio. That is, more precise patterning may be enabled.

The plurality of first partition walls 131 may be arranged in a lattice shape along directions D1 and D2 of FIG. 1. The first partition walls 131 may include an organic material or an inorganic material.

The first partition walls 131 partition each of the pixel areas PX1, PX2, and PX3 to prevent color mixing between the pixels of the plurality of quantum dot color filters 130R and 130G and the transmission layer 130B, and light emitted from the plurality of quantum dot color filters 130R and 130G and the transmission layer 130B may be guided toward a plurality of absorption-type color filters 120R, 120G, and 120B.

Figure 4:
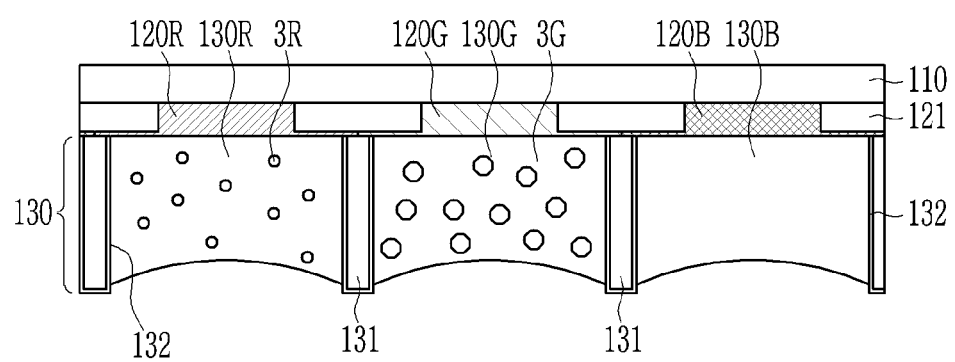
FIG. 4 is an enlarged view of separating and enlarging a portion of the quantum dot color filter layer in the electronic device of FIG. 2.

FIG. 4 is an enlarged view of separating and enlarging a portion of the quantum dot color filter layer 130 of the electronic device 100 of FIG. 2.

Referring to FIG. 4, the surfaces of the first partition walls 131 may be covered with the first light reflecting layer 132. As shown in the drawing, the first light reflecting layer 132 covers all the surfaces of the first partition wall 131 except for the surface in which the first partition wall 131 contacts the absorption-type color filters 120R, 120G, and 120B.

In an embodiment, the first light reflecting layer 132 may include one of Al, Cu, Ni, Ag, Au, and an alloy thereof, molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide or a combination thereof.

In an embodiment, the first light reflecting layer 132 may have visible light reflectance of greater than or equal to at least about 50 percent %, for example, greater than or equal to about 60%, greater than or equal to about 70%, greater than or equal to about 80%, greater than or equal to about 90%, or even about 100%.

Accordingly, light supplied to the plurality of quantum dot color filters 130R and 130G may be reflected by the first light reflecting layer 132 to reach the quantum dots 3R and 3G. As a result, the plurality of quantum dot color filters 130R and 130G may exhibit improved light extraction efficiency.

Figure 5:
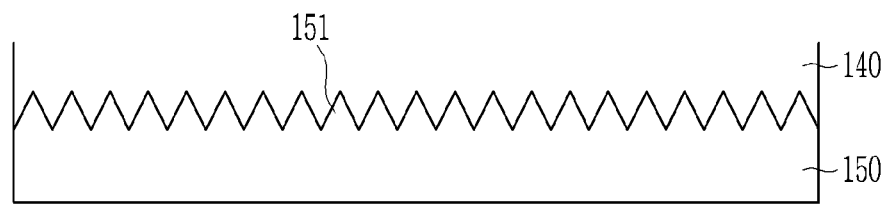
FIG. 5 shows an embodiment of an interface between a first overcoat layer and a thin film encapsulation layer.
Figure 6:
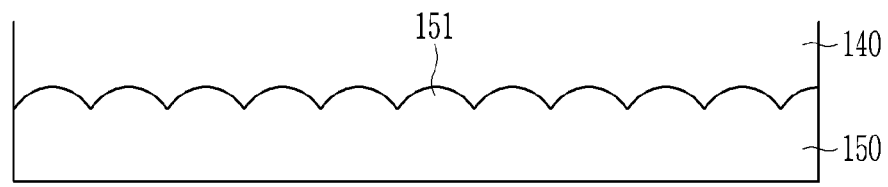
FIG. 6 shows another embodiment of an interface between a first overcoat layer and a thin film encapsulation layer.

FIGS. 5 and 6 show interfaces between the first overcoat layer 140 and the thin film encapsulation layer 150 of the electronic device 100 shown in FIG. 2, respectively.

Referring to FIGS. 5 and 6, the thin film encapsulation layer 150 may include a concavo-convex structure 151 on a surface in contact with the first overcoat layer 140. That is, the surface of the thin film encapsulation layer 150 facing the quantum dot color filter layer 130 may have a concavo-convex structure 151. However, the position where the concavo-convex structure 151 is provided is not necessarily limited thereto, and the concavo-convex structure 151 may be disposed on the surface of the thin film encapsulation layer 150 facing the first substrate 210, or on both surfaces of the thin film encapsulation layer 150.

In addition, when the thin film encapsulation layer 150 has a multilayer structure, the concavo-convex structure 151 may be disposed on any surface of any one of the multilayers. Since the thin film encapsulation layer 150 includes the concavo-convex structure 151 on one surface, the blue light supplied from the plurality of light emitting elements 220A, 220B, and 220C is more efficiently condensed and supplied to the quantum dot color filter layer 130.

The concavo-convex structure 151 may have a prism pattern (in the case of FIG. 5) and/or a convex lens pattern (in the case of FIG. 6), or although not shown, it may have a structure such as a Fresnel lens.

In an embodiment, an inclination angle of the concavo-convex structure 151 vary depending on a type of fine pattern of the concavo-convex structure 151, a material and a thickness of the first overcoat layer 140, a distance between the thin film encapsulation layer 150 and the light emitting elements 220A, 220B, and 220C, a material, a refractive index, a thickness, and the like of the thin film encapsulation layer 150, but in an embodiment, the inclination angle of the concavo-convex structure 151 may be, for example, greater than or equal to about 20 degrees, greater than or equal to about 30 degrees, greater than or equal to about 40 degrees, greater than or equal to about 50 degrees, and, for example, less than about 90 degrees, for example, less than or equal to about 80 degrees, for example, about 20 degrees to about 80 degrees. Herein, the inclination angle means an angle between a plane of the thin film encapsulation layer 150 in which the concavo-convex structure 151 is not provided, or the horizontal direction of FIG. 5 and the (upward or downward) inclination direction of the concavo-convex structure 151.

When the inclination angle of the concavo-convex structure 151 satisfies the aforementioned range, the blue light may be efficiently concentrated using the concavo-convex structure 151 even when a distance between the quantum dot color filter layer 130 and the light emitting elements 220A, 220B, and 220C slightly increases.

An absolute refractive index of the thin film encapsulation layer 150 vary depending on a presence or non-presence of the concavo-convex structure 151 on the surface, a type of the fine pattern of the concavo-convex structure 151, a material and a thickness of the first overcoat layer 140, a distance between the thin film encapsulation layer 150 and light emitting elements 220A, 220B, and 220C, a material, a refractive index, a thickness, etc., of the thin film encapsulation layer 150, but in an embodiment, the absolute refractive index of the thin film encapsulation layer 150 may be greater than or equal to about 1.5, greater than or equal to about 1.6, greater than or equal to about 1.7, greater than or equal to about 1.8, greater than or equal to about 1.9, or greater than or equal to about 2.0, and, for example, less than or equal to about 2.8, less than or equal to about 2.7, less than or equal to about 2.6, less than or equal to about 2.5, or less than or equal to about 2.4, for example, about 1.5 to about 2.5, or about 1.5 to about 2.0. Herein, the absolute refractive index means a refractive index of the target material with respect to the refractive index of the vacuum.

When the absolute refractive index of the thin film encapsulation layer 150 satisfies the above-described range, blue light may be condensed efficiently using the concavo-convex structure 151 even though the distance between the quantum dot color filter layer 130 and the light emitting elements 220A, 220B, 220C slightly increases.

Figure 7:
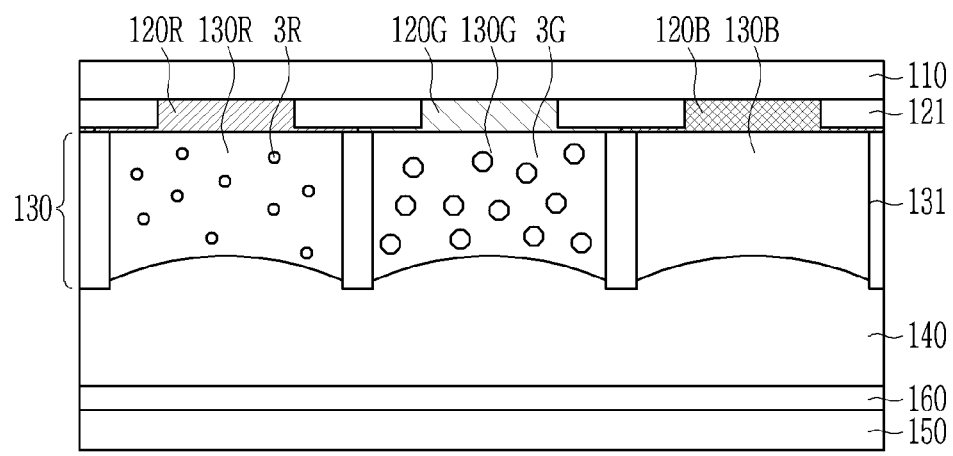
FIG. 7 is a cross-sectional view illustrating an embodiment of a case where a thin film encapsulation layer and a heat dissipation layer are further disposed on a quantum dot color filter layer of an electronic device.

FIG. 7 is a cross-sectional view illustrating an embodiment of a case where a thin film encapsulation layer 150 and a heat dissipation layer 160 are further disposed on a quantum dot color filter layer 130 of an electronic device 100.

The electronic device 100 in an embodiment has a very small pixel area compared with general organic light emitting devices, and thus has a large number of pixels, and may display a high-resolution image. However, heat generated from the plurality of light emitting elements 220A, 220B, and 220C disposed in each pixel may cause degradation of the quality/performance of other components (e.g., the quantum dot color filter layer 130) in the electronic device 100.

Accordingly, the electronic device 100 in an embodiment may further include a heat dissipation layer 160 as shown in FIG. 7.

The heat dissipation layer 160 may dissipate heat generated from the plurality of light emitting elements 220A, 220B, and 220C to radiate the heat to the outside of the electronic device 100. FIG. 7 illustrates that the heat dissipation layer 160 is disposed between the thin film encapsulation layer 150 and the first overcoat layer 140, but is not limited thereto, and it may also be disposed between the thin film encapsulation layer 150 and a plurality of light emitting elements 220A, 220B, and 220C, and both of between the thin film encapsulation layer 150 and the first overcoat layer 140 and between the thin film encapsulation layer 150 and the plurality of light emitting elements 220A, 220B, and 220C.

The heat dissipation layer 160 may include a material having excellent thermal conductivity. The material having excellent thermal conductivity may be a metal or the like.

A thickness of the heat dissipation layer 160 may vary depending on a distance between the quantum dot color filter layer 130 and the plurality of light emitting elements 220A, 220B, and 220C, a material, thermal conductivity, etc., of the first overcoat layer 140 and/or the thin film encapsulation layer 150.

FIGS. 2 to 4, and 7, the absorption-type color filters 120R, 120G, and 120B may be disposed on each of the quantum dot color filters. The plurality of absorption-type color filters 120R, 120G, and 120B may be disposed so as to be overlapped with the plurality of quantum dot color filters 130R and 130G and the transmission layer 130B, respectively.

The plurality of absorption-type color filters 120R, 120G, and 120B may include a material capable of absorbing visible light in a predetermined wavelength region. Accordingly, color purity of light finally emitted from each pixel of the electronic device 100 may be improved.

A material capable of absorbing visible light in a predetermined wavelength range may be an organic material or an organic material. In an embodiment, the plurality of absorption-type color filters 120R, 120G, and 120B may be an adhesive film (e.g., an anisotropic conductive film) including a material capable of absorbing visible light in a predetermined wavelength region, for example.

The plurality of absorption-type color filters 120R, 120G, and 120B may include a first absorption-type color filter 120R in the first pixel area PX1 and a second absorption-type color filter 120G in the second pixel area PX2, and a third absorption-type color filter 120B in the third pixel area PX3.

Each of the plurality of absorption-type color filters 120R, 120G, and 120B may be disposed so as to be overlapped with each of the plurality of light emitting elements 220A, 220B, and 220C. The plurality of absorption-type color filters 120R, 120G, and 120B may be repeatedly disposed along directions D1 and D2.

In an embodiment, the first absorption-type color filter 120R may have a light absorption rate of greater than or equal to about 50%, for example, greater than or equal to about 60%, greater than or equal to about 70%, greater than or equal to about 80%, greater than or equal to about 90%, or even 100% for visible light in a wavelength region other than red light In an embodiment, the second absorption-type color filter 120G may have a light absorption rate of greater than or equal to about 50%, for example, greater than or equal to about 60%, greater than or equal to about 70%, greater than or equal to about 80%, greater than or equal to about 90%, or even 100% for visible light in a wavelength region other than green light.

In an embodiment, the third absorption-type color filter 120B may have a light absorption rate of greater than or equal to about 50%, for example, greater than or equal to about 60%, greater than or equal to about 70%, greater than or equal to about 80%, greater than or equal to about 90%, or even 100% for visible light in a wavelength region other than blue light.

The plurality of absorption-type color filters 120R, 120G, and 120B may be spaced apart from each other by the black matrix 121. The black matrix 121 may be arranged in a lattice shape along the directions D1 and D2 of FIG. 1. The black matrix 121 may be an organic material, an inorganic material, or a metal.

The black matrix 121 partitions the first pixel area to the third pixel area PX1, PX2, and PX3 to prevent color mixing of light emitted from a plurality of quantum dot color filters 130R and 130G and transmission layer 130B and the light supplied to the plurality of absorption-type color filters 120R, 120G, and 120B may be guided to be emitted to the outside of the electronic device 100.

In an embodiment, the vertical length of the black matrix 121 is illustrated to be lower than that of the plurality of absorption-type color filters 120R, 120G, and 120B, but is not limited thereto, for example. It may be equal to or higher than the vertical length of the plurality of absorption-type color filters 120R, 120G, and 120B.

A second substrate 110 may be disposed on the absorption-type color filters 120R, 120G, and 120B and the black matrix 121.

In an embodiment, the second substrate 110 may be a transparent substrate, for example, the second substrate 110 may include glass, sapphire ($Al_2O_3$), gallium nitride (GaN), silicon carbide (SiC), gallium oxide ($Ga_2O_3$), lithium gallium oxide ($LiGaO_2$), lithium aluminum oxide ($LiAlO_2$), or magnesium aluminum oxide ($MgAl_2O_4$).

Hereinafter, a plurality of light emitting elements 220A, 220B, and 220C in an embodiment are described with reference to FIG. 8. FIG. 8 is a schematic cross-sectional view of any one of a plurality of light emitting elements 220A, 220B, and 220C in an embodiment.

In an embodiment, each of the plurality of light emitting elements 220A, 220B, and 220C includes a first conductivity-type semiconductor layer 221 on the first substrate 210 and an active layer 222 on the first conductivity-type semiconductor layer 221, and a second conductivity-type semiconductor layer 223 on the active layer 222 and overlapped with the first conductivity-type semiconductor layer 221, for example.

The first conductivity-type semiconductor layer 221 may be an n-type semiconductor layer and the second conductivity-type semiconductor layer 223 may be a p-type semiconductor layer. In addition, the first conductivity-type semiconductor layer 221 and the second conductivity-type semiconductor layer 223 may include a nitride semiconductor. The first conductivity-type semiconductor layer 221 and the second conductivity-type semiconductor layer 223 may have a composition formula of $Al_xIn_yGa_{1-x-y}N$ (wherein, $0 \le x \le 1$, $0 \le y \le 1$, and $0 \le x+y \le 1$). The first conductivity-type semiconductor layer 221 and the second conductivity-type semiconductor layer 223 may include at least one material of GaN, AlGaN, and InGaN. In an embodiment, the first conductivity-type semiconductor layer 221 may include a nitride semiconductor material doped with an n-type and the second conductivity-type semiconductor layer 223 may include a nitride semiconductor material doped with a p-type, for example. In an embodiment, the first conductivity-type semiconductor layer 221 may include GaN doped with an n-type and the second conductivity-type semiconductor layer 223 may include GaN doped with a p-type, for example.

The active layer 222 may emit light having predetermined energy due to recombination of electrons and holes and have a multi quantum wells ("MQW") structure of alternately stacking the quantum well layer and the quantum barrier layer. The MQW structure may have an InGaN/GaN structure. The first conductivity-type semiconductor layer 221, the active layer 222, and the second conductivity-type semiconductor layer 223 may be epitaxial layers.

In an embodiment, the plurality of light emitting elements 220A, 220B, and 220C may be provided by a metal-organic chemical vapor deposition ("MOCVD"), hydride vapor phase epitaxy ("HVPE"), or molecular beam epitaxy ("MBE") process, for example.

Although not shown in the drawings, a nitride semiconductor thin film may be disposed between the first substrate 210 and the plurality of light emitting elements 220A, 220B, and 220C. The nitride semiconductor thin film may serve as a buffer layer to mitigate lattice mismatch between the first substrate 210 and the first conductivity-type semiconductor layer 221.

The first conductivity-type semiconductor layer 221 may be connected to a first electrode 225, and the second conductivity-type semiconductor layer 223 may be connected to a second electrode 224. The first electrode 225 and the second electrode 224 are separated and do not contact each other.

The first electrode 225 and the second electrode 224 may include a metal or an alloy having high reflectance in a wavelength region of light emitted from each of the light emitting elements 220A, 220B, and 220C. The first electrode 225 and the second electrode 224 may each include a single layer including a single material of Au, Sn, Ni, Pb, Ag, In, Cr, Ge, Si, Ti, W, and Pt or an alloy including at least two materials thereof or a multilayer including a combination thereof.

Figure 9:
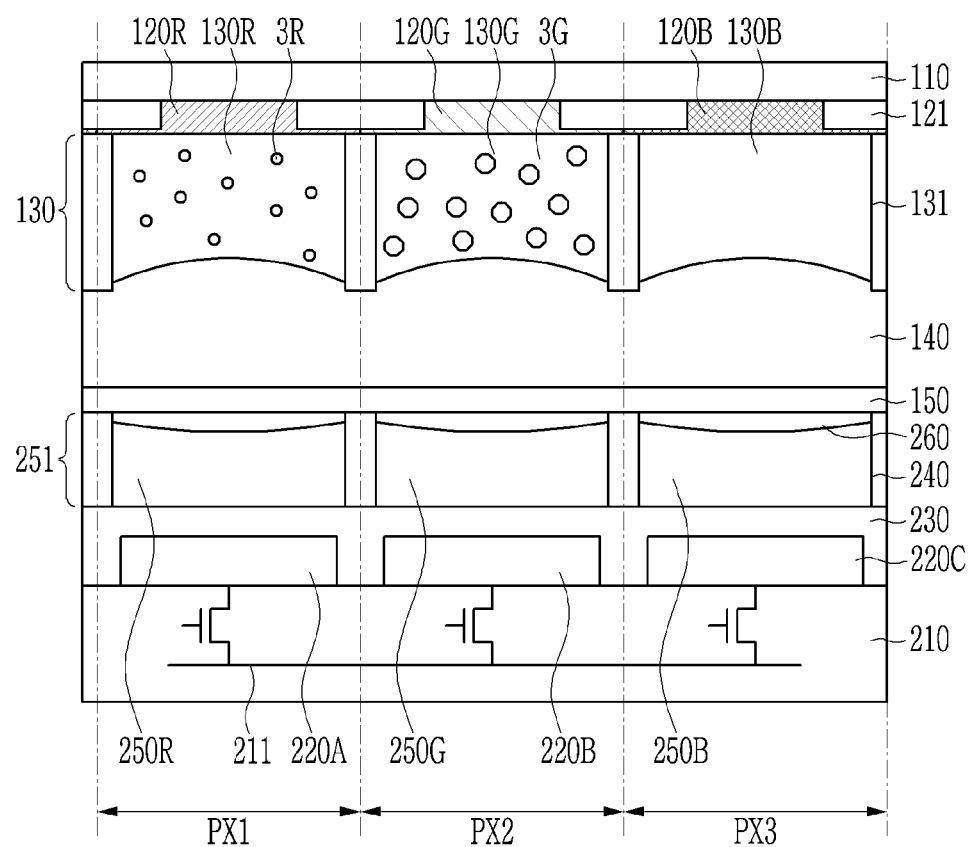
FIGS. 9 and 10 are cross-sectional views showing an embodiment of exemplary variations of an electronic device.
Figure 10:
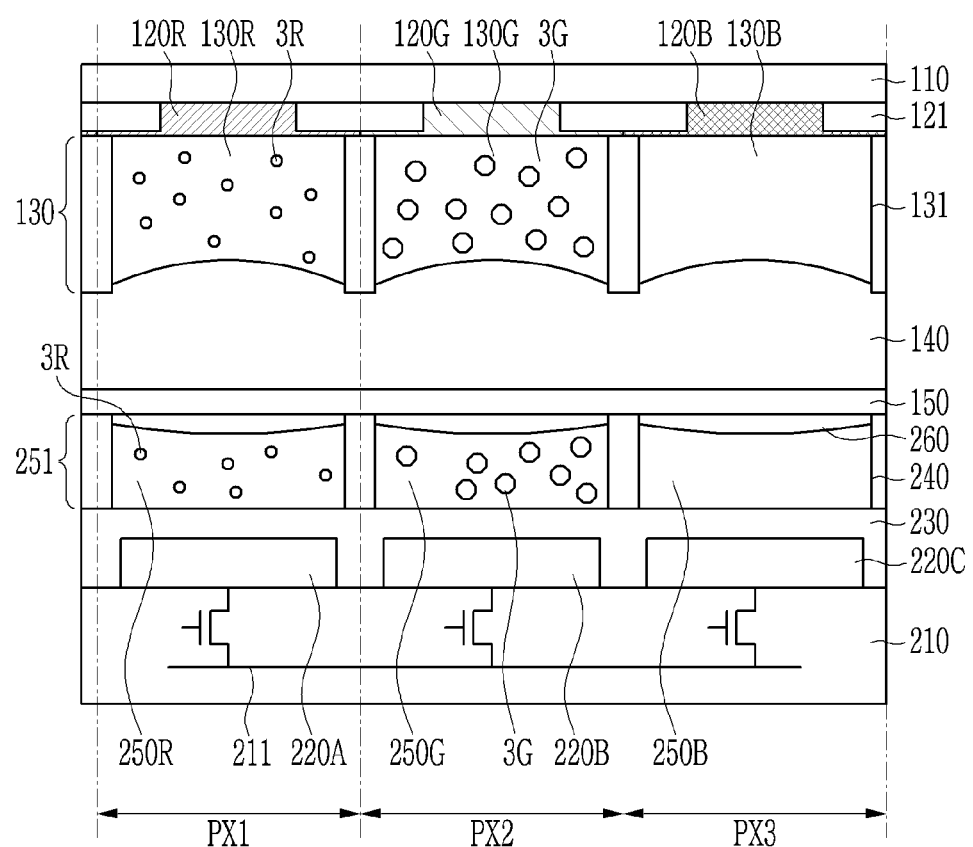

Hereinafter, referring to FIGS. 9 and 10, additional color filters are filled in the spaces 251R, 251G, and 251B partitioned by the plurality of second partition walls 240 in the light guide layer 251. FIGS. 9 and 10 are cross-sectional views illustrating various embodiments of the electronic device 100.

Referring to FIGS. 9 and 10, a plurality of auxiliary color filters 250R, 250G, and 250B may be filled in each of the spaces partitioned by the plurality of second partition walls 240. The plurality of auxiliary color filters 250R, 250G, and 250B may include a first auxiliary color filter 250R overlapped with the first light emitting element 220A, and a second auxiliary color filter 250G overlapped with the second light emitting element 220B, and a third auxiliary color filter 250B overlapped with the third light emitting element 220C.

Each of the first to third auxiliary color filters 250R, 250G and 250B may include an organic/inorganic dye and an organic/inorganic pigment. In an alternative embodiment, the first and second auxiliary color filters 250R and 250G include organic/inorganic dyes and organic/inorganic pigments, but the third auxiliary color filter 250B may be a light transmission layer including a transparent resin without separate organic/inorganic dyes or organic/inorganic pigments.

In an alternative embodiment, at least one of the first auxiliary color filter 250R and the second auxiliary color filter 250G may include quantum dots 3R and 3G. In this case, the first and second auxiliary color filters 250R and 250G may convert and emit light incident from the first and second light emitting elements 220A and 220B, respectively, using quantum dots 3R and 3G. Even in this case, the third auxiliary color filter 250B may not include a separate quantum dot and may be a light transmission layer including a transparent resin.

In an embodiment, the first auxiliary color filter 250R may include red quantum dots 3R, for example. Accordingly, the incident blue light may be converted into red light and then emitted.

In an embodiment, the second auxiliary color filter 250G may include green quantum dots 3G, for example. Accordingly, the incident blue light may be converted into green light and then emitted.

A second overcoat layer 260 may be disposed on the auxiliary color filters 250R, 250G, and 250B.

The second overcoat layer 260 may cover the surfaces of the first to third auxiliary color filters 250R, 250G, and 250B to planarize them. When the third auxiliary color filter 250B is the light transmission layer, it may fill the empty space of the auxiliary color filter 250B.

The second overcoat layer 260 may be an inorganic material or an organic material. When the second overcoat layer 260 includes an inorganic material, the inorganic material may include silicon oxide or silicon nitride.

In an embodiment, a thickness of the second overcoat layer 260 varies depending on a thickness of the auxiliary color filter layer, a target thickness of the electronic device 100, and brightness and resolution of each of the plurality of light emitting elements 220A, 220B, and 220C, etc. However, in an embodiment, the second overcoat layer 260 may have a thickness of greater than about 0 μm and less than or equal to about 1 μm, for example.

When the thickness of the second overcoat layer 260 satisfies the aforementioned range, the upper surface of the auxiliary color filter layer may be easily planarized and thus occurrence of defects such as a step difference may be minimized in a subsequent process such as bonding of the first substrate 210 and the second substrate 110.

However, in another embodiment, the second overcoat layer 260 may be omitted depending on surface shapes of the auxiliary color filters 250R, 250G, and 250B, the number of stacked light guide layers 251, and the like.

Figure 11:
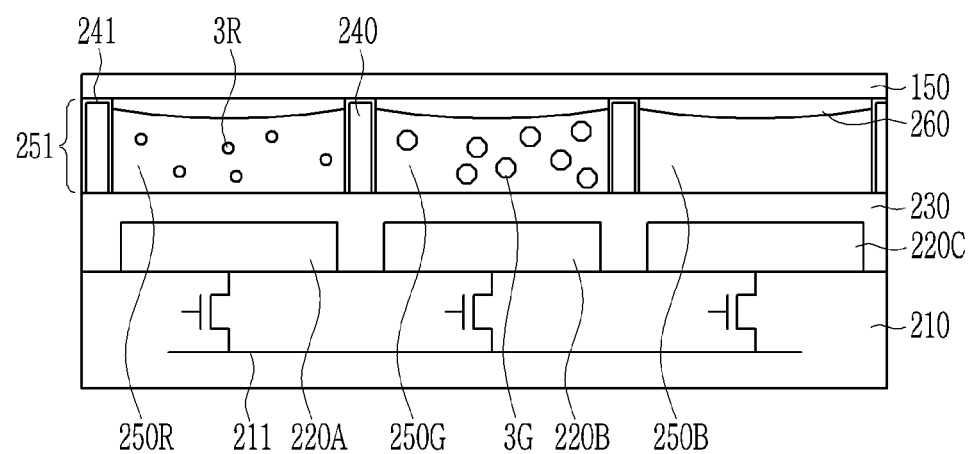
FIG. 11 is a cross-sectional view of an embodiment of a light emitting element and a light guide layer disposed thereon of an electronic device.

FIG. 11 is an enlarged view separately showing an embodiment of a second substrate 210, a plurality of light emitting elements 220A, 220B, and 220C disposed on the second substrate 210, a light guide layer 251 disposed thereon, and a thin film encapsulation layer 150 disposed on the light guide layer 251 in the structure of the electronic device 100.

Referring to FIG. 11, the surfaces of the plurality of second partition walls 240 disposed in the light guide layer 251 may be covered with a second light reflecting layer 241. As illustrated, the second light reflecting layer 241 may cover all surfaces of the second partition walls 240 except for a surface in which the second partition walls 240 contact the protective layer 230.

In an embodiment, the second light reflecting layer 241 may include one of Al, Cu, Ni, Ag, Au, and an alloy thereof, molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide or a combination thereof.

In an embodiment, the second light reflecting layer 241 may have a visible light reflectance of greater than or equal to at least about 50%, for example, greater than or equal to about 60%, greater than or equal to about 70%, greater than or equal to about 80%, greater than or equal to about 90%, or even about 100%.

Accordingly, since the light supplied to a plurality of auxiliary color filters 250R, and 250G may be reflected by the second light reflecting layer 241, possibility that the light reaches the quantum dots 3R and 3G may be improved.

Although not shown in FIG. 11, a heat dissipation layer 160 (refer to FIG. 7) and/or a Bragg reflector 170 (refer to FIG. 15) may be further disposed between the plurality of auxiliary color filters 250R, 250G, and 250B and the plurality of light emitting elements 220A, 220B, and 220C. In an embodiment, the heat dissipation layer 160 and/or the Bragg reflector 170 may be disposed between the protective layer 230 and the plurality of light emitting elements 220A, 220B, and 220C, for example.

The electronic device 100 in an embodiment has a very small pixel area, compared with general organic light emitting devices, and thus has a large number of pixels, and may display a high-resolution image. However, since each pixel area is very small relative to those of the OLEDs, even though a color filter including quantum dots is used, there is a limit to increasing the absolute amount of the quantum dots in the pixel area. The electronic device in an embodiment 100, as shown in FIGS. 10 to 11, the plurality of auxiliary color filters 250R and 250G including the quantum dots 3R and 3G may be further included in the plurality of quantum dot color filters 130R and 130G. Accordingly, the ratio of the quantum dots in the pixel areas is increased, and as a result, light extraction efficiency of the electronic device 100 may be increased, and particularly, red and green light extraction efficiency thereof may be greatly improved.

Figure 12:
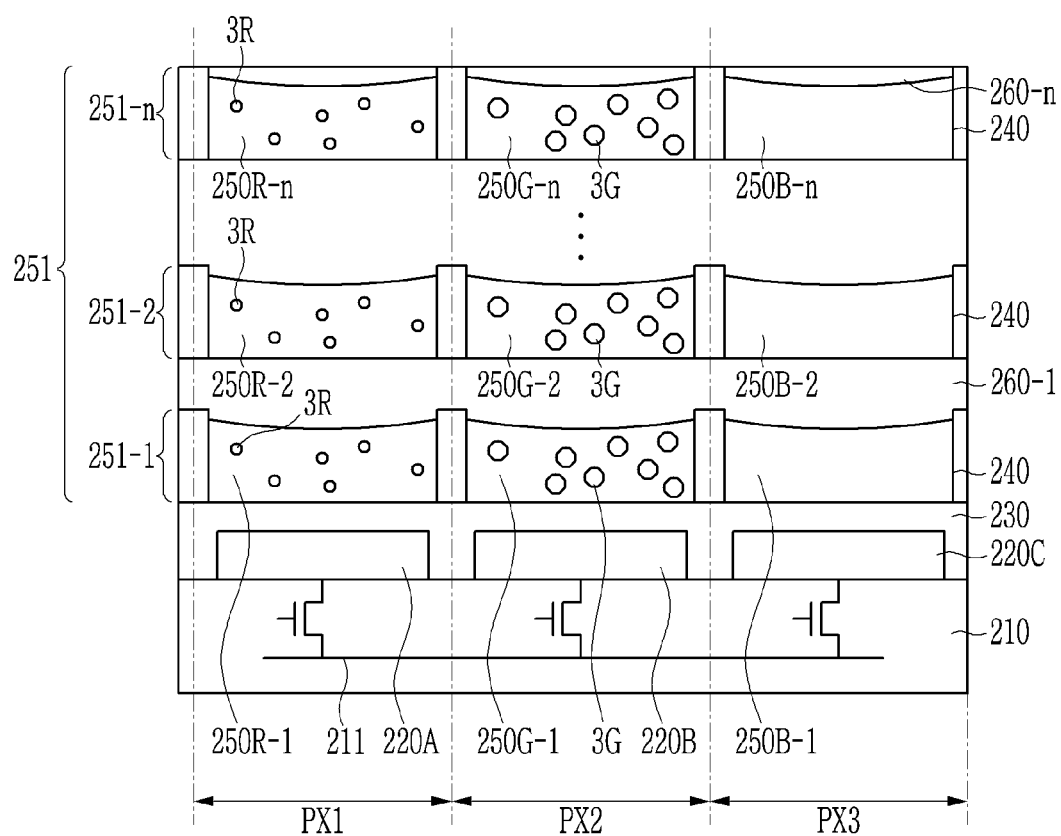
FIG. 12 shows an embodiment in which two or more light guide layers are additionally stacked on the light emitting element of the electronic device.

FIG. 12 shows an example in which two or more light guide layers 251 are stacked.

Referring to FIG. 12, two or more light guide layers 251 may be stacked apart from each other at a predetermined distance along a direction D3 of FIG. 1, that is, a vertical direction of the electronic device 100. In an embodiment, n light guide layers 251-1 to 251-n (where n is an integer of 2 or more) may be stacked apart from each other, for example.

In an embodiment, each of the light guide layers 251-1 to 251-n may include the first auxiliary color filters 250R-1 to 250R-n, the second auxiliary color filters 250G-1 to 250G-n, and third auxiliary color filters 250B-1 to 250B-n, respectively, for example.

The stacked light guide layers 251-1 to 251-n may be spaced apart by the second overcoat layers 260-1 to 260-n−1. The second overcoat layer 260-n may be disposed on the uppermost light guide layer 251-n among the light guide layers 251-1 to 251-n, or may be omitted in some cases.

Figure 13:
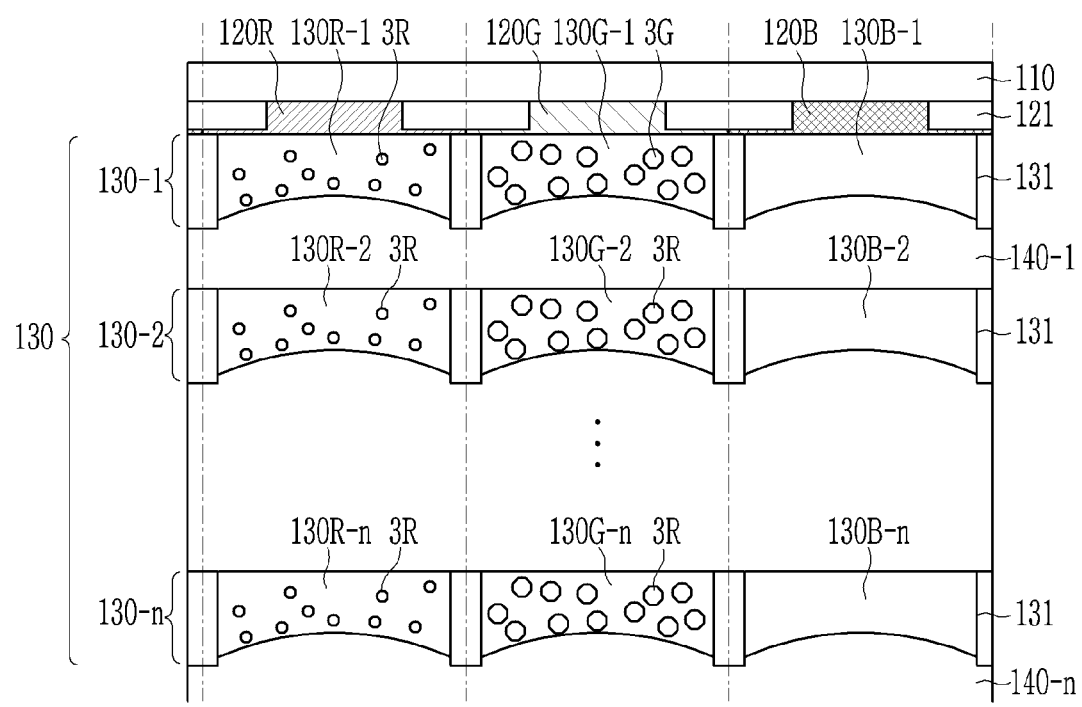
FIG. 13 illustrates an embodiment in which two or more quantum dot color filter layers are additionally stacked on an electronic device.

FIG. 13 illustrates an embodiment in which two or more quantum dot color filter layers 130 are additionally stacked on an electronic device.

Referring to FIG. 13, two or more quantum dot color filter layer 130, like the light guide layer 251 described above, may be stacked apart from each other at a predetermined distance along the direction D3 of FIG. 1, that is, the vertical direction of the electronic device 100. In an embodiment, n quantum dot color filter layers 130-1 to 130-n (where n is an integer of 2 or more) may be stacked apart from each other, for example.

In an embodiment, each of the quantum dot color filter layers 130-1 to 130-n may include the first quantum dot color filters 130R-1 to 130R-n, the second quantum dot color filters 130G-1 to 130G-n, and the transmission layers 130B-1 to 130B-n, respectively, for example.

The stacked quantum dot color filter layers 130-1 to 130-n may be spaced apart by the first overcoat layers 140-1 to 140-n. The first overcoat layer 140-n may be disposed on the uppermost quantum dot color filter layer 130-n among the quantum dot color filter layers 130-1 to 130-n, or may be omitted in some cases.

Figure 14:
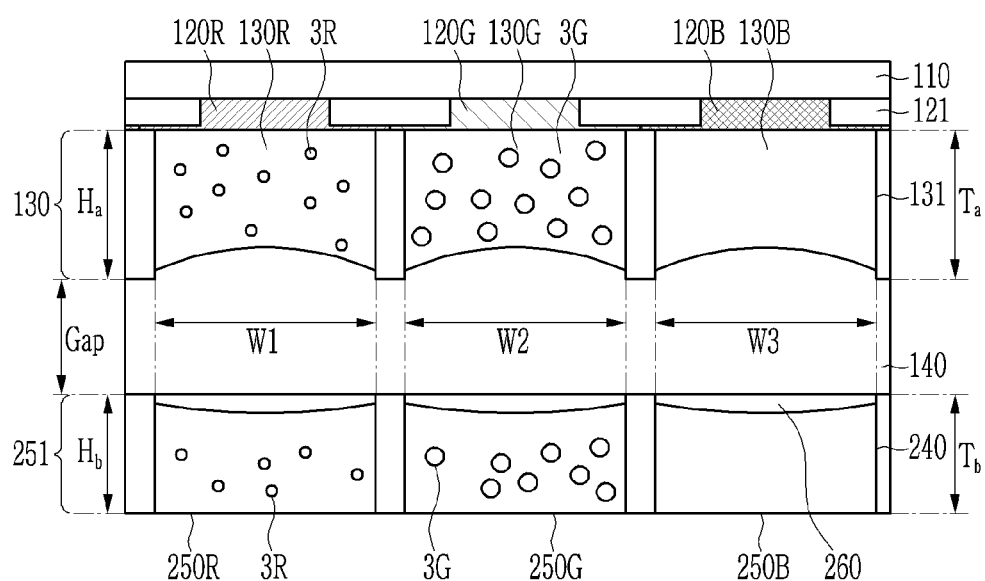
FIG. 14 is a view separately showing portions alone of a quantum dot color filter layer and a light guide layer in the cross-section of the electronic device of FIG. 10.

FIG. 14 is an enlarged view of a quantum dot color filter layer 130 and a light guide layer 251 in the structure of the electronic device 100 shown in FIG. 10.

Referring to FIG. 14, the quantum dot color filters 130R, 130G, and 130B in the quantum dot color filter layer 130 may respectively have predetermined widths W1, W2, and W3 and each have a height $T_a$, and the auxiliary color filters 250R, 250G, and 250B in the light guide layer 251 may respectively have predetermined widths W1, W2, and W3 and each have a height $T_b$, and the quantum dot color filter layer 130 and the light guide layer 251 may also be disposed apart with a predetermined gap.

In an embodiment, the first quantum dot color filter 130R belonging to the quantum dot color filter layer 130 and the first auxiliary color filter 250R belonging to the light guide layer 251 may have the same width W1, for example. The second quantum dot color filter 130G and the second auxiliary color filter 250G corresponding each other may have the same width W2, and in addition, the transmission layer 130B and the third auxiliary color filter 250B corresponding each other may have the same width W3.

In an embodiment, the first quantum dot color filter 130R and the first auxiliary color filter 250R, the second quantum dot color filter 130G and the second auxiliary color filter 250G, and the transmission layer 130B and the third auxiliary color filter 250B may be provided to have a horizontal length corresponding to a horizontal length of each of the plurality of light emitting elements 220A, 220B, 220C (refer to FIG. 12), for example. In consideration of the emitted light having a Lambertian distribution of the plurality of light emitting elements 220A, 220B, 220C, the horizontal length may be appropriately selected. In an embodiment, the horizontal length W1 of the first quantum dot color filter 130R and the first auxiliary color filter 250R, and the horizontal length W2 of the second quantum dot color filter 130G and the second auxiliary color filter 250G, and the horizontal length W3 of the transmission layer 130B and the third auxiliary color filter 250B may satisfy a range, for example, greater than or equal to about 0.5 µm, greater than or equal to about 1 µm, greater than or equal to about 1.5 µm, or greater than or equal to about 2 µm, and, for example, less than or equal to about 10 µm, less than or equal to about 9 µm, less than or equal to about 8 µm, less than or equal to about 7 µm, or less than or equal to about 6 µm, for example, about 0.5 µm to about 10 µm, about 0.5 µm to about 9 µm, about 0.5 µm to about 8 µm, about 0.5 µm to about 7 µm, or about 1 µm to about 10 µm, respectively.

In an embodiment, the first quantum dot color filter 130R and the first auxiliary color filter 250R, the second quantum dot color filter 130G and the second auxiliary color filter 250G, and the transmission layer 130B and the third auxiliary color filter 250B may have a pitch between neighboring layers of greater than or equal to about 0.5 µm, greater than or equal to about 1 µm, greater than or equal to about 1.5 µm, or greater than or equal to about 2 µm, and, for example, less than or equal to about 10 µm, less than or equal to about 9 µm, less than or equal to about 8 µm, less than or equal to about 7 µm, or less than or equal to about 6 µm, for example, about 0.5 µm to about 10 µm, about 0.5 µm to about 9 µm, about 0.5 µm to about 8 µm, about 0.5 µm to about 7 µm, about 0.5 µm to about 6 µm, or about 1 µm to about 6 µm.

In this way, the widths of the first quantum dot color filter 130R and the first auxiliary color filter 250R, the second quantum dot color filter 130G and the second auxiliary color filter 250G, and the transmission layer 130B and the third auxiliary color filter 250B and the pitch of each pair of neighboring layers may be adjusted, so that even though the plurality of light emitting elements 220A, 220B, and 220C is disposed to have pixel density of greater than or equal to about 2000 ppi, the electronic device 100 may smoothly display ultra-high resolution and/or ultra-high brightness images through the quantum dot color filter layer 130 and the light guide layer 251.

As an example, the height $T_a$ of the plurality of quantum dot color filters 130R and 130G and the transmission layer 130B may be equal to or lower than the height Ha of the first partition walls 131. That is, the height $T_a$ of each of the first quantum dot color filter 130R, the second quantum dot color filter 130G, and the transmission layer 130B may be less than or equal to the height Ha of the first partition walls 131.

In an embodiment, the height $T_b$ of the plurality of auxiliary color filters 250R, 250G, and 250B may also be equal to or lower than the height $H_b$ of the second partition walls 240, for example. That is, the height $T_b$ of each of the first auxiliary color filter 250R, the second auxiliary color filter 250G, and the third auxiliary color filter 250B may be less than or equal to the height $H_b$ of the second partition walls 240.

In an embodiment, the height $T_a$ of the plurality of quantum dot color filters 130R, 130G and the transmission layer 130B and the height $T_b$ of the plurality of auxiliary color filters 250R, 250G, 250B may be greater than or equal to about 0.5 µm, greater than or equal to about 1 µm, greater than or equal to about 2 µm, or greater than or equal to about 3 µm, for example, about 3 µm to about 10 µm, about 3 µm to about 8 µm, about 3 µm to about 6 µm, or about 3 µm to about 5 µm, respectively.

In an embodiment, the plurality of quantum dot color filters 130R, and 130B, the transmission layer 130B, and the plurality of auxiliary color filters 250R, 250G, and 250B may have a horizontal length-to-height ratio of about 4:1 to about 1:1, for example. When the horizontal length-to-height ratio of each of the plurality of quantum dot color filters 130R, and 130B, the transmission layer 130B, and the plurality of auxiliary color filters 250R, 250G, and 250B increases to about 1:1, the plurality of quantum dot color filters 130R, and 130B, the transmission layer 130B, and the plurality of auxiliary color filters 250R, 250G, and 250B may have a considerably narrow horizontal length, that is, a high horizontal length-to-height ratio. That is, more precise patterning may be enabled.

The electronic device 100 in an embodiment may be adjusted to have the gap between the quantum dot color filter layer 130 and the light guide layer 251 in the range less than or equal to about 1 µm or about 50 nm to about 1 µm. In an embodiment, when two or more quantum dot color filter layers 130 and light guide layers 251 are each stacked (i.e., to have a structure shown in FIGS. 12 and 13), the gap may be the shortest gap between quantum dot color filters 130R-n and 130G-n and a transmission layer 130B-n of the quantum dot color filter layer 130, which are disposed on top among the quantum dot color filter layers 130, and auxiliary color filters 250R-n, 250G-n, and 250B-n of the light guide layer 251, which are disposed on top among the light guide layers 251, for example.

In the electronic device 100 in an embodiment, when the gap between the quantum dot color filter layer 130 and the light guide layer 251 satisfies the ranges, light emitted from the plurality of light emitting elements 220A, 220B, and 220C may be well guided toward the quantum dot color filter layer 130 and the light guide layer 251.

In general, since the electronic device 100 has pixel density of less than or equal to about 500 ppi, pixels and color filters corresponding thereto are relatively wide.

When the pixel density of the electronic device 100 is increased up to greater than or equal to about 2000 ppi, the widths of the color filters corresponding thereto become ultra-fine. However, because of the limitation of an ultra-precise patterning process, even when the width of the color filters is secured, depth of the color filters may be difficult to process up to a desired level. When the depth of the color filters is not secured, the content of the quantum dots filled in the color filter pixels due to the depth of the color filters may be reduced, compared with conventional electronic devices.

In other words, in the electronic device 100 having pixel density of greater than or equal to about 2000 ppi and thus displaying an image of ultra-high resolution and/or ultra-high brightness, the content of the quantum dots in the quantum dot color filters 130R and 130G in the quantum dot color filter layer 130 may be significantly reduced, compared with the conventional electronic devices due to the limitation of the ultrafine patterning process, and accordingly, light extraction efficiency of the electronic device 100 may be greatly deteriorated.

However, the electronic device 100 in an embodiment, as described above, include the quantum dot color filter layer 130 including the plurality of quantum dot color filters 130R, 130G, and 130B, which are disposed on the light emitting elements 220A, 220B, and 220C and respectively overlapped therewith, and the light guide layer 251 including the plurality of auxiliary color filters 250R, 250G, and 250B. In addition, two or more quantum dot color filter layers 130 and/or light guide layers 251 may be respectively stacked, wherein despite the limitation of the aforementioned ultrafine patterning process, the content of the quantum dots of the electronic device 100 may be secured up to a predetermined level or higher. Accordingly, even though the electronic device 100 is disposed to have device density of greater than or equal to about 2000 ppi, the electronic device 100 may display an image of ultra-high resolution and/or ultra-high brightness as well as exhibit excellent color purity and color reproducibility without deteriorating light efficiency and the like.

Figure 15:
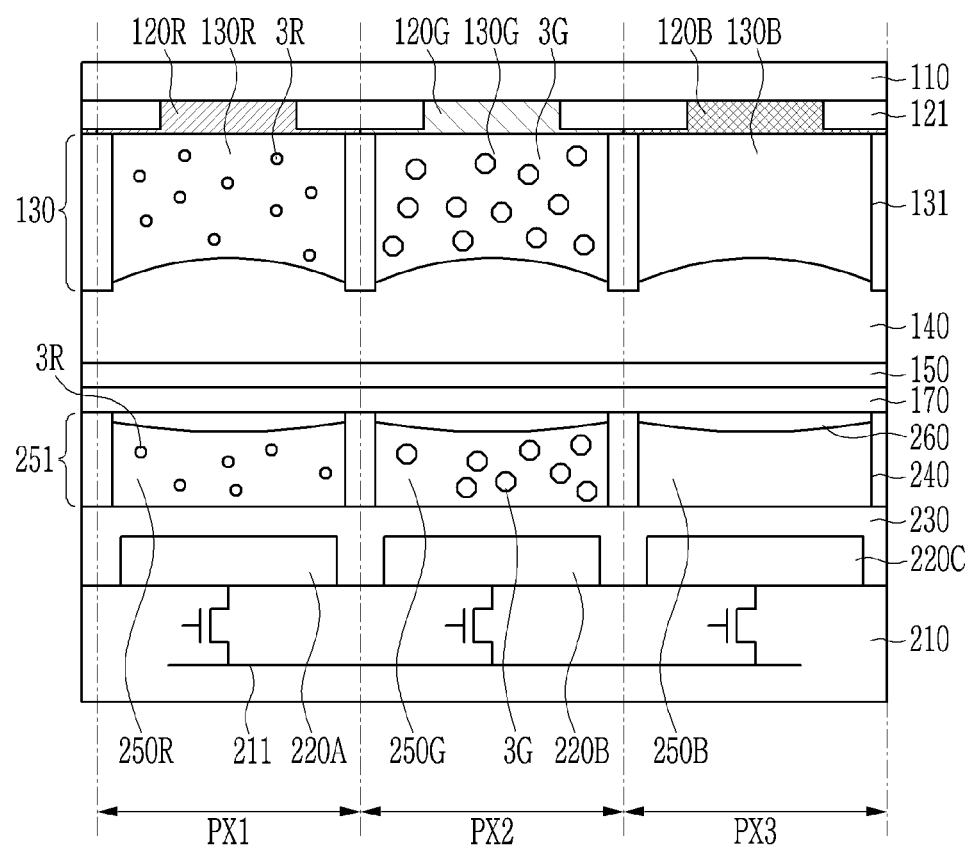
FIG. 15 shows an embodiment of a structure in which a thin film encapsulation layer and a Bragg reflector are disposed between a quantum dot color filter layer and a light guide layer in an electronic device.

FIG. 15 shows an embodiment of a structure in which a thin film encapsulation layer 150 and a Bragg reflector 170 are disposed between a quantum dot color filter layer 130 and a light guide layer 251 in an electronic device 100.

The electronic device 100 in an embodiment may further include the Bragg reflector 170 between the quantum dot color filter layer 130 and the light guide layer 251. The Bragg reflector 170 may be included alone without the thin film encapsulation layer 150 or along with the thin film encapsulation layer 150, as shown in FIG. 15. When used along with the thin film encapsulation layer 150, the Bragg reflector 170 may be disposed between the quantum dot color filter layer 130 and the thin film encapsulation layer 150 and/or between the plurality of light emitting elements 220A, 220B, and 220C and the thin film encapsulation layer 150.

The Bragg reflector 170 may play a role of smoothly guiding light emitted from the light guide layer 251 toward the quantum dot color filter layer 130.

In addition, the Bragg reflector 170 may include a plurality of layers alternately stacked and having different refractive indexes. In an embodiment, the Bragg reflector 170 has a stacking structure of alternately twice or more disposing a low refractive index layer and a high refractive index layer, for example.

The Bragg reflector 170 may include an organic material, an inorganic material, or a combination thereof. In an embodiment, the Bragg reflector 170 may include a dielectric material of $SiO_2$, $Al_2O_3$, MgO, $TiO_2$, $Ta_2O_5$, ITO, $ZrO_2$, $Si_3N_4$, etc., as the inorganic material, for example.

In an embodiment, the Bragg reflector 170 may be adjusted to have a predetermined thickness within a range satisfying the aforementioned gap between the quantum dot color filter layer 130 and the auxiliary color filter layer, for example. In an embodiment, the Bragg reflector 170 may have a thickness of greater than or equal to about 50 nm, greater than or equal to about 100 nm, greater than or equal to about 150 nm, greater than or equal to about 200 nm, greater than or equal to about 250 nm, or greater than or equal to about 300 nm, for example, less than or equal to about 1 μm (e.g., when the Bragg reflector 170 fills the gap between the quantum dot color filter layer 130 and the auxiliary color filter layer), for example, less than or equal to about 950 nm, less than or equal to about 900 nm, less than or equal to about 850 nm, less than or equal to about 800 nm, less than or equal to about 750 nm, less than or equal to about 700 nm, less than or equal to about 650 nm, or less than or equal to about 600 nm, for example, about 50 nm to about 1 μm, for example, about 100 nm to about 1 μm, for example, about 100 nm to about 800 nm, for example, about 100 nm to about 700 nm, for example, about 200 nm to about 600 nm. As shown in FIG. 15, a sum of the thickness of the Bragg reflector 170 and the thickness of the thin film encapsulation layer 150 may be adjusted to be less than or equal to about 1 μm.

Hereinafter, a method of manufacturing the electronic device 100 in an embodiment is described with reference to FIGS. 16 to 21. FIGS. 16 to 21 show cross-sections of components manufactured in each step according to a method of manufacturing the electronic device 100. Descriptions of the same constituent elements as the above-described constituent elements may be omitted.

The electronic device 100 in an embodiment may be manufactured by respectively forming a lower panel including a plurality of light emitting elements and an upper panel including the quantum dot color filter layer 130 including a plurality of quantum dot color filters and then, bonding the lower panel and the upper panel. Hereinafter, referring to FIGS. 16 to 21, the processes of forming the lower panel and the upper panel and bonding them are illustrated.

Figure 16:
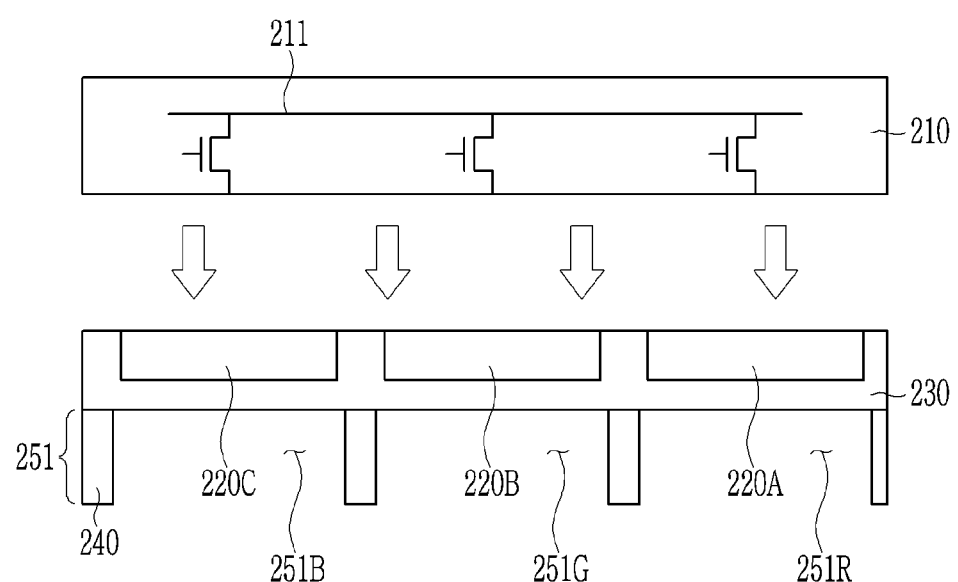
FIGS. 16 to 21 are cross-sectional views illustrating an embodiment of a method of manufacturing an electronic device.

Referring to FIG. 16, the protective layer 230 is disposed on a silicon substrate (not shown), and the plurality of light emitting elements 220A, 220B, and 220C having a horizontal length and a vertical length which are less than or equal to about 10 μm is disposed thereon.

Subsequently, the silicon substrate is etched to have a predetermined pattern surrounding a space where the plurality of light emitting elements 220A, 220B, and 220C is disposed and to form the light guide layer 251 including a plurality of the second partition walls 240 arranged in a lattice shape.

Then, an IC unit may be bonded to the plurality of light emitting elements 220A, 220B, and 220C. In an embodiment, as shown in FIG. 16, the first substrate 210 including the IC unit 211 is bonded to directly contact the plurality of light emitting elements 220A, 220B, and 220C and the protective layer 230. In an embodiment, the bonding of the first substrate 210 may be performed at about 250 degrees Celsius (° C.) to about 350° C., for example, about 250° C. to about 320° C., for example, for about 5 minutes to about 20 minutes, for example, about 5 minutes to about 15 minutes. Accordingly, the lower panel including the plurality of light emitting elements is completed.

Optionally, the auxiliary color filters 250R, 250G, and 250B (refer to FIG. 11) may be filled in the spaces 251R, 251G, and 251B divided by the plurality of second partition walls 240 of the light guide layer 251.

In addition, a second overcoat layer (not shown) may be optionally disposed on the light guide layer 251 filled with the auxiliary color filters 250R, 250G, and 250B.

Optionally, the silicon substrate is etched in the same method as used to form the light guide layer 251 and thus separately manufacture the light guide layer 251 alone without including the plurality of light emitting elements thereunder. More than two light guide layers 251 manufactured in this way may be, when necessary, stacked to manufacture the electronic device 100 having at least two light guide layers 251.

Figure 17:
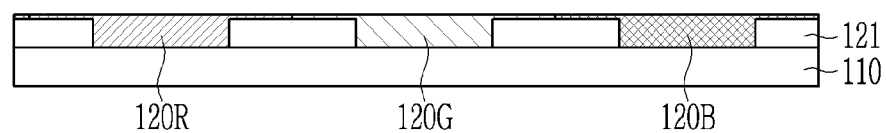

Apart from the process of FIG. 16, as shown in FIG. 17, the black matrix 121 is disposed on the second substrate 110, and the absorption-type color filters 120R, 120G, and 120B are filled in spaces among the black matrixes 121. The plurality of absorption-type color filters 120R, 120G, and 120B may be provided by coating a resin including a pigment and/or a dye and curing it or by disposing and attaching ready-made films.

Figure 18:
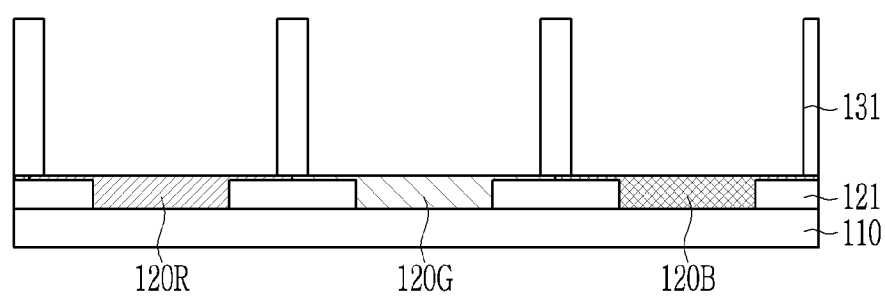

Subsequently, as shown in FIG. 18, the plurality of first partition walls 131 is provided to partition regions, which are respectively overlapped with the plurality of light emitting elements 220A, 220B, and 220C on the absorption-type color filters 120R, 120G, and 120B. The first partition walls 131 may be disposed to be respectively overlapped with the plurality of second partition walls 240 forming the light guide layer 251 shown in FIG. 16.

Figure 19:
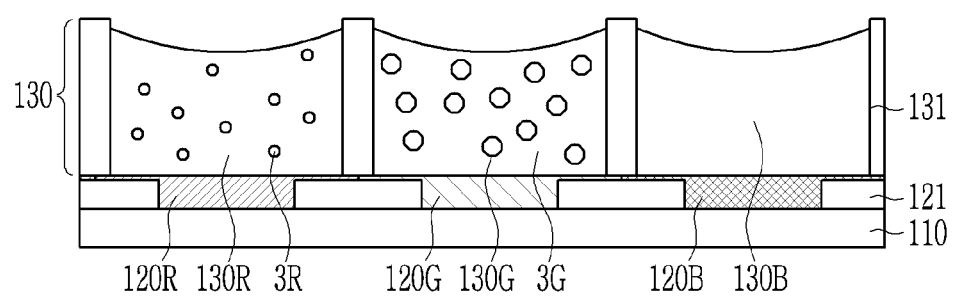

Subsequently, as shown in FIG. 19, the quantum dot color filters 130R and 130G are provided by injecting a quantum dot color filter composition into the regions divided by the first partition walls 131. A region corresponding to the transmission layer 130B is left as an empty space, or a transparent resin passing blue light may be injected thereinto.

Optionally, on the quantum dot color filters 130R and 130G, a first overcoat layer 140 is provided to complete the quantum dot color filter layer 130. Herein, the first overcoat layer 140 may be filled in the empty space of the transmission layer 130B.

The first overcoat layer 140 may be provided by a known coating method such as spin coating, spray coating, bar coating, gravure coating, and the like to coat and cure the composition.

In addition, the process of forming the quantum dot color filter layer 130 may be repeated to form at least two quantum dot color filter layers 130.

Figure 20:
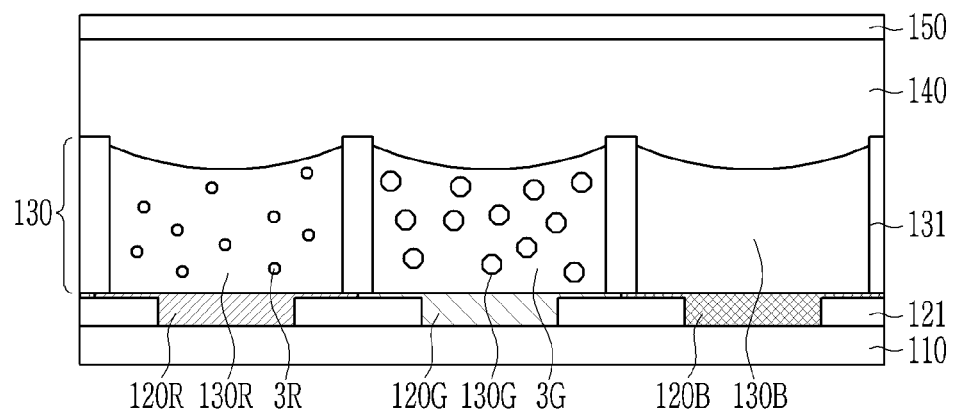

As shown in FIG. 20, on the overcoat layer 140, optionally, any one component including one of the thin film encapsulation layer 150, the heat dissipation layer 160 (refer to FIG. 7), the Bragg reflector 170 (refer to FIG. 15), and a combination thereof may be additionally provided.

The thin film encapsulation layer 150, the heat dissipation layer 160, and the Bragg reflector layer 170 may be provided using a known deposition method such as atomic layer deposition or chemical vapor deposition, in the case of an inorganic layer, and may be provided using a known coating method such as spin coating, spray coating, bar coating, gravure coating, etc., in the case of an organic layer.

The processes according to FIGS. 17 to 20 may be performed at a temperature less than or equal to about 230° C., for example, less than or equal to about 210° C., less than or equal to about 190° C., or less than or equal to about 180° C., in consideration of preventing deterioration of the quantum dot color filter layer 130.

Figure 21:
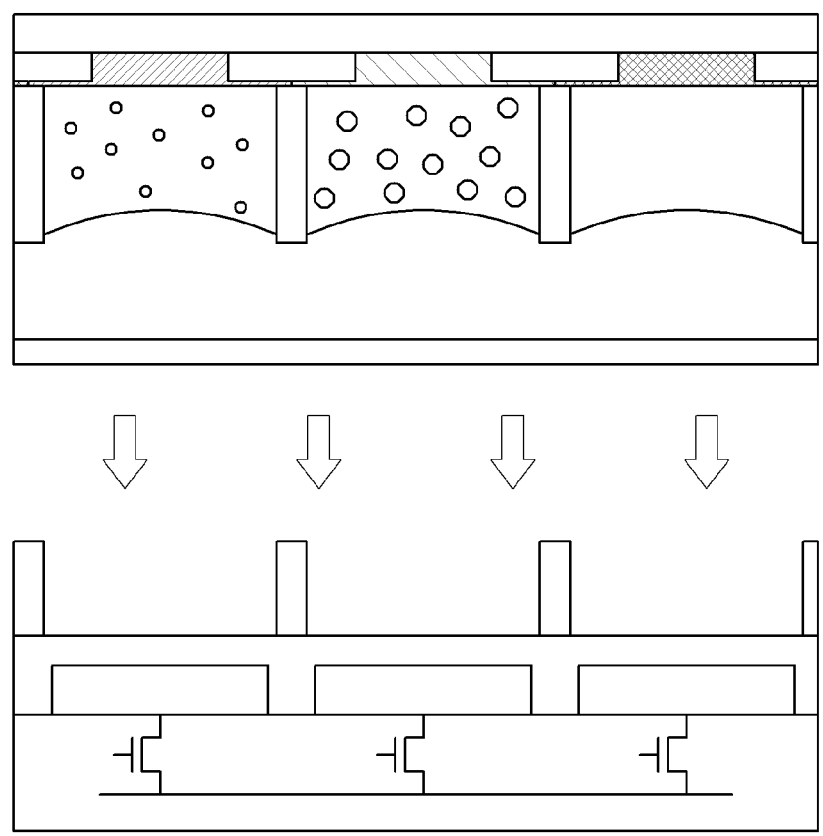

Subsequently, as shown in FIG. 21, the lower panel and the upper panel are bonded each other to manufacture the electronic device 100. Specifically, on the light guide layer 251 of the lower panel, the first overcoat layer 140 of the upper panel is bonded to manufacture the electronic device 100 in an embodiment. Herein, the plurality of quantum dot color filters 130R and 130G partitioned by the plurality of first partition walls 131 of the upper panel may be bonded to be respectively overlapped with the plurality of light emitting elements 220A, 220B, and 220C of the lower panel.

In this way, when the electronic device 100 is completed by bonding the lower panel already with which the IC unit 211 is already bonded with the upper panel including the quantum dot color filters, the quantum dot color filter layer 130 may not be heat-treated at a high temperature (e.g., about 250° C., for example, greater than or equal to about 270° C.). Accordingly, the method of manufacturing the electronic device 100 in an embodiment may prevent degradation, damage, and the like of the quantum dot color filter layer 130, and as a result, the electronic device 100 may exhibit high light efficiency, color purity, and color reproducibility and display high-resolution images.

Hereinbefore, the predetermined embodiments of the invention have been described and illustrated, however, it is apparent to a person with ordinary skill in the art that the invention is not limited to the embodiment as described, and may be variously modified and transformed without departing from the spirit and scope of the invention.

What is claimed is:

1. An electronic device, comprising
a first substrate,
a plurality of light emitting elements each having a horizontal length and a vertical length which are less than or equal to about 10 micrometers, each of the plurality of light emitting elements being disposed on the first substrate,
a quantum dot color filter layer disposed on the plurality of light emitting elements, the quantum dot color filter layer comprising:
a plurality of quantum dot color filters partitioned by a plurality of first partition walls so as to be overlapped with the plurality of light emitting elements, respectively; and
a first overcoat layer between the plurality of light emitting elements and the quantum dot color filter layer; and
a light guide layer between the plurality of light emitting elements and the first overcoat layer, and
the light guide layer comprises a plurality of second partition walls overlapped with the plurality of first partition walls.

2. The electronic device of claim 1, wherein the plurality of quantum dot color filters comprises a first quantum dot color filter comprising quantum dots which convert third light into first light, and a second quantum dot color filter comprising quantum dots which convert third light into second light.

3. The electronic device of claim 1, wherein the quantum dot color filter layer further comprises a transmission layer which does not comprise the quantum dot color filter.

4. The electronic device of claim 1, wherein a space partitioned by the plurality of second partition walls in the light guide layer is defined as an empty space or is filled with a gas, an organic material, an inorganic material, or an auxiliary color filter.

5. The electronic device of claim 1, further comprising: a thin film encapsulation layer between the quantum dot color filter layer and the first overcoat layer, or between the first overcoat layer and the light guide layer.

6. The electronic device of claim 5, wherein the thin film encapsulation layer has a thickness of about 50 nanometers to about 1000 nanometers.

7. The electronic device of claim 5, wherein a surface of the thin film encapsulation layer facing the quantum dot color filter layer has a concavo-convex structure.

8. The electronic device of claim 5, wherein the thin film encapsulation layer comprises a metal oxide, a metal nitride, a metal oxynitride, or a combination thereof.

9. The electronic device of claim 5, further comprising: a heat dissipation layer or a Bragg reflector between the thin film encapsulation layer and the quantum dot color filter layer, and/or between the thin film encapsulation layer and the plurality of light emitting elements.

10. The electronic device of claim 1, wherein each of the plurality of light emitting elements comprises a first conductivity-type semiconductor layer on the first substrate, a second conductivity-type semiconductor layer overlapped with the first conductivity-type semiconductor layer, and an active layer between the first conductivity-type semiconductor layer and the second conductivity-type semiconductor layer.

11. The electronic device of claim 1, wherein the light guide layer is provided in plural such that two or more light guide layers are stacked apart from each other at a predetermined distance.

12. The electronic device of claim 1, wherein the quantum dot color filter layer is provided in plural such that two or more quantum dot color filter layers are stacked apart from each other at a predetermined distance.

13. A display device comprising the electronic device of claim 1.

* * * * *